(12) United States Patent
Lin

(10) Patent No.: US 6,673,710 B1
(45) Date of Patent: Jan. 6, 2004

(54) METHOD OF CONNECTING A CONDUCTIVE TRACE AND AN INSULATIVE BASE TO A SEMICONDUCTOR CHIP

(75) Inventor: Charles W. C. Lin, Singapore (SG)

(73) Assignee: Bridge Semiconductor Corporation, Taipei (TW)

( * ) Notice: Subject to any disclaimer, the term of this patent is extended or adjusted under 35 U.S.C. 154(b) by 57 days.

(21) Appl. No.: 09/962,754

(22) Filed: Sep. 24, 2001

Related U.S. Application Data

(63) Continuation-in-part of application No. 09/878,626, filed on Jun. 11, 2001, which is a continuation-in-part of application No. 09/687,619, filed on Oct. 13, 2000.

(51) Int. Cl.⁷ .............................................. H01L 21/44
(52) U.S. Cl. ........................ 438/611; 438/106; 438/107
(58) Field of Search ............................... 438/106, 107, 438/118, 125, 611, 612, 614, 617, 618

(56) References Cited

U.S. PATENT DOCUMENTS

| | | | |
|---|---|---|---|
| 4,442,967 A | 4/1984 | van de Pas et al. | 228/159 |
| 4,661,192 A | 4/1987 | McShane | 156/292 |
| 4,717,066 A | 1/1988 | Goldenberg et al. | 228/179 |
| 4,750,666 A | 6/1988 | Neugebauer et al. | 228/179 |
| 4,807,021 A | 2/1989 | Okumura | 357/75 |
| 4,925,083 A | 5/1990 | Farassat et al. | 228/102 |
| 4,937,653 A | 6/1990 | Blonder et al. | 357/68 |
| 4,955,523 A | 9/1990 | Calomagno et al. | 228/179 |
| 4,970,571 A | 11/1990 | Yamakawa et al. | 357/71 |
| 4,984,358 A | 1/1991 | Nelson | 29/830 |
| 5,014,111 A | 5/1991 | Tsuda et al. | 357/68 |
| 5,060,843 A | 10/1991 | Yasuzato et al. | 228/179 |
| 5,074,947 A | 12/1991 | Estes et al. | 156/307.3 |
| 5,090,119 A | 2/1992 | Tsuda et al. | 29/843 |

(List continued on next page.)

FOREIGN PATENT DOCUMENTS

| | | | |
|---|---|---|---|
| EP | 0 718 882 A1 | 6/1996 | ......... H01L/23/057 |
| WO | WO 97/38563 | 10/1997 | ............. H05K/1/03 |
| WO | WO 99/57762 | 11/1999 | ........... H01L/23/48 |

OTHER PUBLICATIONS

Markstein et al., "Controlling the Variables in Stencil Printing," Electronic Packaging & Production, Feb. 1997, pp. 48–56.

Elenius, "Choosing a Flip Chip Bumping Supplier—Technology an IC Package contractor should look for," Advanced Packaging, Mar./Apr. 1998, pp. 70–73.

Erickson, "Wafer Bumping: The Missing Link for DCA," Electronic Packaging & Production, Jul. 1998, pp. 43–46.

Kuchenmeister et al., "Film Chip Interconnection Systems Prepared by Wet Chemical Metallization," IEEE publication 0–7803–4526–6/98, Jun. 1998, 5 pages.

Ghaffarian, "Long Time BGA Assembly Reliability," Advancing Microelectronics, vol. 25, No. 6, Sep./Oct. 1998, pp. 20–23.

U.S. application Ser. No. 09/465,024, filed Dec. 16, 1999, entitled "Bumpless Flip Chip Assembly with Solder Via".

U.S. application Ser. No. 09/464,562, filed Dec. 16, 1999, entitled "Bumpless Flip Chip Assembly With Strips and Via–Fill".

(List continued on next page.)

*Primary Examiner*—Phuc T. Dang
(74) *Attorney, Agent, or Firm*—David M. Sigmond

(57) ABSTRACT

A method of connecting a conductive trace and an insulative base to a semiconductor chip includes providing a semiconductor chip, a conductive trace and an insulative base, wherein the chip includes a conductive pad and the insulative base contacts the conductive trace on a side opposite the chip, then forming a through-hole that extends through the insulative base and exposes the conductive trace and the pad, and then forming a connection joint that contacts and electrically connects the conductive trace and the pad.

300 Claims, 24 Drawing Sheets

U.S. PATENT DOCUMENTS

| | | | |
|---|---|---|---|
| 5,106,461 A | 4/1992 | Volfson et al. | 205/125 |
| 5,116,463 A | 5/1992 | Lin et al. | 156/653 |
| 5,137,845 A | 8/1992 | Lochon et al. | 437/183 |
| 5,167,992 A | 12/1992 | Lin et al. | 427/437 |
| 5,172,851 A | 12/1992 | Matsushita et al. | 228/179 |
| 5,196,371 A | 3/1993 | Kulesza et al. | 437/183 |
| 5,209,817 A | 5/1993 | Ahmad et al. | 156/643 |
| 5,237,130 A | 8/1993 | Kulesza et al. | 174/260 |
| 5,260,234 A | 11/1993 | Long | 437/203 |
| 5,261,593 A | 11/1993 | Casson et al. | 228/180.22 |
| 5,275,330 A | 1/1994 | Issacs et al. | 228/180.2 |
| 5,284,796 A | 2/1994 | Nakanishi et al. | 437/183 |
| 5,293,067 A | 3/1994 | Thompson et al. | 257/668 |
| 5,294,038 A | 3/1994 | Nakano et al. | 228/179.1 |
| 5,327,010 A | 7/1994 | Uenaka et al. | 257/679 |
| 5,334,804 A | 8/1994 | Love et al. | 174/267 |
| 5,346,750 A | 9/1994 | Hatakeyama et al. | 428/209 |
| 5,355,283 A | 10/1994 | Marrs et al. | 361/760 |
| 5,358,621 A | 10/1994 | Oyama | 205/123 |
| 5,364,004 A | 11/1994 | Davidson | 228/1.1 |
| 5,397,921 A | 3/1995 | Karnezos | 257/779 |
| 5,407,864 A | 4/1995 | Kim | 437/203 |
| 5,424,245 A | 6/1995 | Gurtler et al. | 437/183 |
| 5,438,477 A | 8/1995 | Pasch | 361/689 |
| 5,439,162 A | 8/1995 | George et al. | 228/180.22 |
| 5,447,886 A | 9/1995 | Rai | 437/183 |
| 5,454,161 A | 10/1995 | Beilin et al. | 29/852 |
| 5,454,928 A | 10/1995 | Rogers et al. | 205/125 |
| 5,475,236 A | 12/1995 | Yoshizaki | 257/48 |
| 5,477,933 A | 12/1995 | Nguyen | 174/262 |
| 5,478,007 A | 12/1995 | Marrs | 228/180.22 |
| 5,483,421 A | 1/1996 | Gedney et al. | 361/771 |
| 5,484,647 A | 1/1996 | Nakatani et al. | 428/209 |
| 5,485,949 A | 1/1996 | Tomura et al. | 228/180.5 |
| 5,487,218 A | 1/1996 | Bhatt et al. | 29/852 |
| 5,489,804 A | 2/1996 | Pasch | 257/778 |
| 5,493,096 A | 2/1996 | Koh | 219/121.71 |
| 5,508,229 A | 4/1996 | Baker | 437/183 |
| 5,525,065 A | 6/1996 | Sobhani | 439/67 |
| 5,536,973 A | 7/1996 | Yamaji | 257/737 |
| 5,542,601 A | 8/1996 | Fallon et al. | 228/119 |
| 5,547,740 A | 8/1996 | Higdon et al. | 428/209 |
| 5,556,810 A | 9/1996 | Fujitsu | 437/209 |
| 5,556,814 A | 9/1996 | Inoue et al. | 437/230 |
| 5,564,181 A | 10/1996 | Dineen et al. | 29/841 |
| 5,572,069 A | 11/1996 | Schneider | 257/690 |
| 5,576,052 A | 11/1996 | Arledge et al. | 427/98 |
| 5,583,073 A | 12/1996 | Lin et al. | 439/183 |
| 5,595,943 A | 1/1997 | Itabashi et al. | 437/230 |
| 5,599,744 A | 2/1997 | Koh et al. | 437/195 |
| 5,611,140 A | 3/1997 | Kulesza et al. | 29/832 |
| 5,611,884 A | 3/1997 | Bearinger et al. | 156/325 |
| 5,613,296 A | 3/1997 | Kurino et al. | 29/852 |
| 5,614,114 A | 3/1997 | Owen | 219/121.66 |
| 5,615,477 A | 4/1997 | Sweitzer | 29/840 |
| 5,619,791 A | 4/1997 | Lambrecht, Jr. et al. | 29/852 |
| 5,627,405 A | 5/1997 | Chillara | 257/668 |
| 5,627,406 A | 5/1997 | Pace | 257/700 |
| 5,633,204 A | 5/1997 | Tago et al. | 438/614 |
| 5,637,920 A | 6/1997 | Loo | 257/700 |
| 5,641,113 A | 6/1997 | Somaki et al. | 228/180.22 |
| 5,645,628 A | 7/1997 | Endo et al. | 106/1.23 |
| 5,646,067 A | 7/1997 | Gaul | 437/180 |
| 5,648,686 A | 7/1997 | Hirano et al. | 257/778 |
| 5,654,584 A | 8/1997 | Fujitsu | 257/666 |
| 5,656,858 A | 8/1997 | Kondo et al. | 257/737 |
| 5,663,598 A | 9/1997 | Lake et al. | 257/737 |
| 5,665,652 A | 9/1997 | Shimizu | 438/127 |
| 5,666,008 A | 9/1997 | Tomita et al. | 257/778 |
| 5,669,545 A | 9/1997 | Pham et al. | 228/1.1 |
| 5,674,785 A | 10/1997 | Akram et al. | 437/217 |
| 5,674,787 A | 10/1997 | Zhao et al. | 437/230 |
| 5,682,061 A | 10/1997 | Khandros et al. | 257/666 |
| 5,686,353 A | 11/1997 | Yagi et al. | 437/183 |
| 5,691,041 A | 11/1997 | Frankeny et al. | 428/209 |
| 5,722,162 A | 3/1998 | Chou et al. | 29/852 |
| 5,723,369 A | 3/1998 | Barber | 438/106 |
| 5,731,223 A | 3/1998 | Padmanabhan | 437/183 |
| 5,736,456 A | 4/1998 | Akram | 438/614 |
| 5,739,585 A | 4/1998 | Akram et al. | 257/698 |
| 5,744,859 A | 4/1998 | Ouchida | 257/668 |
| 5,757,071 A | 5/1998 | Bhansali | 257/697 |
| 5,757,081 A | 5/1998 | Chang et al. | 257/778 |
| 5,764,486 A | 6/1998 | Pendse | 361/774 |
| 5,774,340 A | 6/1998 | Chang et al. | 361/771 |
| 5,789,271 A | 8/1998 | Akram | 438/18 |
| 5,798,285 A | 8/1998 | Bentlage et al. | 438/108 |
| 5,801,072 A | 9/1998 | Barber | 438/107 |
| 5,801,447 A | 9/1998 | Hirano et al. | 257/778 |
| 5,803,340 A | 9/1998 | Yeh et al. | 228/56.3 |
| 5,803,344 A | 9/1998 | Stankavich et al. | 228/180 |
| 5,804,771 A | 9/1998 | McMahon et al. | 174/255 |
| 5,808,360 A | 9/1998 | Akram | 257/738 |
| 5,811,879 A | 9/1998 | Akram | 257/723 |
| 5,813,115 A | 9/1998 | Misawa et al. | 29/832 |
| 5,817,541 A | 10/1998 | Averkiou et al. | 438/107 |
| 5,822,856 A | 10/1998 | Bhatt et al. | 29/832 |
| 5,834,844 A | 11/1998 | Akagawa et al. | 257/734 |
| 5,861,666 A | 1/1999 | Bellaar | 257/686 |
| 5,863,816 A | 1/1999 | Cho | 438/123 |
| 5,870,289 A | 2/1999 | Tokuda et al. | 361/779 |
| 5,872,399 A | 2/1999 | Lee | 257/738 |
| 5,883,435 A | 3/1999 | Geffken et al. | 257/758 |
| 5,924,622 A | 7/1999 | Davis et al. | 228/56.3 |
| 5,925,931 A | 7/1999 | Yamamoto | 257/737 |
| 5,966,803 A | 10/1999 | Wilson | 29/840 |
| 5,973,393 A | 10/1999 | Chia et al. | 257/690 |
| 5,994,222 A | 11/1999 | Smith et al. | 438/689 |
| 6,012,224 A | 1/2000 | DiStefano et al. | 29/840 |
| 6,013,571 A | 1/2000 | Morrell | 438/612 |
| 6,013,877 A | 1/2000 | Degani et al. | 174/264 |
| 6,017,812 A | 1/2000 | Yonezawa et al. | 438/613 |
| 6,018,196 A | 1/2000 | Noddin | 257/777 |
| 6,020,561 A | 2/2000 | Ishida et al. | 174/261 |
| 6,037,665 A | 3/2000 | Miyazaki | 257/773 |
| 6,046,909 A | 4/2000 | Joy | 361/748 |
| 6,084,297 A | 7/2000 | Brooks et al. | 257/698 |
| 6,084,781 A | 7/2000 | Klein | 361/771 |
| 6,088,236 A | 7/2000 | Tomura et al. | 361/783 |
| 6,103,552 A | 8/2000 | Lin | 438/113 |
| 6,103,992 A | 8/2000 | Noddin | 219/121.71 |
| 6,127,204 A | 10/2000 | Isaacs et al. | 438/106 |
| 6,159,770 A | 12/2000 | Tetaka et al. | 438/112 |
| 6,258,704 B1 * | 7/2001 | Turner | |

OTHER PUBLICATIONS

U.S. application Ser. No. 09/464,561, filed Dec. 16, 1999, entitled "Bumpless Flip Chip Assembly With Strips–In–Via And Plating".

U.S. application Ser. No. 09/120,408, filed Jul. 22, 1998, entitled "Flip Chip Assembly With Via Interconnection".

U.S. application Ser. No. 09/643,212, filed Aug. 22, 2000, entitled "Semiconductor Chip Assembly With Simultaneously Electroplated Contact Terminal and Connection Joint".

U.S. application Ser. No. 09/643,214, filed Aug. 22, 2000, entitled "Semiconductor Chip Assembly With Simultaneously Electrolessly Plated Contact Terminal And Connection Joint".

U.S. application Ser. No. 09/643,213, filed Aug. 22, 2000, entitled "Method Of Making A Support Circuit For A Semiconductor Chip Assembly".

U.S. application Ser. No. 09/643,445, filed Aug. 22, 2000, entitled "Method Of Making A Semiconductor Chip Assembly".

U.S. application Ser. No. 09/665,928, filed Sep. 20, 2000, entitled "Semiconductor Chip Assembly with Ball Bond Connection Joint".

U.S. application Ser. No. 09/665,931, filed Sep. 20, 2000, entitled "Method Of Making A Support Circuit With A Tapered Through–Hole For A Semiconductor Chip Assembly".

U.S. application Ser. No. 09/677,207, filed Oct. 2, 2000, entitled "Method Of Making A Semiconductor Chip Assembly With A Conductive Trace Subtractively Formed Before And After Chip Attachment".

U.S. application Ser. No. 09/865,367, filed May 24, 2001, entitled "Semiconductor Chip Assembly With Simultaneously Electroplated Contact Terminal and Connection Joint".

U.S. application Ser. No. 09/864,555, filed May 24, 2001, entitled "Semiconductor Chip Assembly With Simultaneously Electrolessly Plated Contact Terminal and Connection Joint".

U.S. application Ser. No. 09/864,773, filed May 24, 2001, entitled "Semiconductor Chip Assembly With Ball Bond Connection Joint".

* cited by examiner

METHOD OF CONNECTING A CONDUCTIVE TRACE AND AN INSULATIVE BASE TO A SEMICONDUCTOR CHIP

CROSS-REFERENCE TO RELATED APPLICATIONS

This application is a continuation-in-part of U.S. application Ser. No. 09/878,626 filed Jun. 11, 2001, which is a continuation-in-part of U.S. application Ser. No. 09/687,619 filed Oct. 13, 2000, each of which is incorporated by reference.

BACKGROUND OF THE INVENTION

1. Field of the Invention

The present invention relates to a semiconductor chip assembly, and more particularly to a method of connecting a conductive trace and an insulative base to a semiconductor chip.

2. Description of the Related Art

Semiconductor chips have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding.

Wire bonding is by far the most common and economical connection technique. In this approach, wires are bonded, one at a time, from the chip to external circuitry by thermocompression, thermosonic or ultrasonic processes. In thermocompression bonding, fine gold wire is fed from a spool through a clamp and a capillary. A thermal source is swept past an end of the wire to form a wire ball that protrudes from the capillary. The chip or capillary is then heated to about 200 to 300° C., the capillary is brought down over an aluminum pad, the capillary exerts pressure on the wire ball, and the wire ball forms a ball bond on the pad. The capillary is then raised and moved to a terminal on the support circuit, the capillary is brought down again, and the combination of force and temperature forms a wedge bond between the wire and the terminal. Thus, the connection between the pad and the terminal includes the ball bond (which only contacts the pad), the wedge bond (which only contacts the terminal) and the wire between the bonds. After raising the capillary again, the wire is ripped from the wedge bond, the thermal source is swept past the wire to form a new wire ball, and the process is repeated for other pads on the chip. Thermosonic bonding is similar to thermocompression bonding but adds ultrasonic vibration as the ball and wedge bonds are formed so that less heat is necessary. Ultrasonic bonding uses aluminum wire to form wedge bonds without applying heat. There are many variations on these basic methods.

TAB involves bonding gold-bumped pads on the chip to external circuitry on a polymer tape using thermocompression bonding. TAB requires mechanical force such as pressure or a burst of ultrasonic vibration and elevated temperature to accomplish metallurgical welding between the wires or bumps and the designated surface.

Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Organic conductive adhesive bumps with conductive fillers in polymer binders have been used in place of solder bumps, but they do not normally form a metallurgical interface in the classical sense. A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used.

While flip-chip technology has tremendous advantages over wire bonding and TAB, its cost and technical limitations are significant. For instance, the cost of forming bumps on the pads is significant. In addition, an adhesive is normally underfilled between the chip and the support circuit to reduce stress on the solder joints due to thermal mismatch between the chip and the support circuit, and the underfilling process increases both manufacturing complexity and cost. Furthermore, the solder joints exhibit increased electrical resistance as well as cracks and voids over time due to fatigue from thermo-mechanical stresses.

Other techniques besides wire bonding, TAB and flip-chip bonding have been developed to connect chips to external circuitry without using wires, leads or bumps. Such techniques include thin film rerouting at the wafer, panel or module level, and attaching a pre-patterned substrate to the chip such that through-holes in the substrate expose the pads and selectively applying conductive material into the through-holes.

A typical thin film routing approach includes depositing a dielectric material on the chip, providing through-holes in the dielectric material that expose the pads, providing metallization in the through-holes that contacts the pads, and providing a top layer of conductive circuitry on the dielectric material that contacts the metallization. In this manner, the additional circuitry is fabricated on the chip. Drawbacks to this approach include complicated manufacturing requirements, high cost, and chip loss if the additional circuitry is defective. In particular, since the chip or wafer provides a substrate for the additional circuitry, chips will be lost if the additional circuitry fails to achieve certain quality and yield criteria. Unpredictable chip loss has prevented the wide spread adoption of this "chip first" approach in volume production. Furthermore, if the process is not performed on wafers, the commercially available silicon wafer processing equipment may not be compatible with common tooling and handling techniques.

The semiconductor chip assembly is subsequently connected to another circuit such as a printed circuit board (PCB) or mother board during next level assembly. Different semiconductor assemblies are connected to the next level assembly in different ways. For instance, ball grid array (BGA) packages contain an array of solder balls, and land grid array (LGA) packages contain an array of metal pads that receive corresponding solder traces on the PCB.

Thermo-mechanical wear or creep of the solder joints that connect the semiconductor chip assembly to the next level assembly is a major cause of failure in most board assemblies. This is because non-uniform thermal expansion and/or contraction of different materials causes mechanical stress on the solder joints.

Thermal mismatch induced solder joint stress can be reduced by using materials having a similar coefficient of thermal expansion (CTE). However, due to large transient temperature differences between the chip and other materials during power-up of the system, the induced solder joint stress makes the assembly unreliable even when the chip and the other materials have closely matched thermal expansion coefficients.

Thermal mismatch induced solder joint stress can also be reduced by proper design of the support circuit. For instance, BGA and LGA packages have been designed with pillar post type contact terminals that extend above the package and act as a stand-off or spacer between the package and the PCB in order to absorb thermal stress and reduce solder joint fatigue. The higher the aspect ratio of the pillar, the more easily the pillar can flex to follow expansion of the two ends and reduce shear stress.

Conventional approaches to forming the pillar either on a wafer or a separate support circuit include a bonded interconnect process (BIP) and plating using photoresist.

BIP forms a gold ball on a pad of the chip and a gold pin extending upwardly from the gold ball using a thermocompression wire bonder. Thereafter, the gold pin is brought in contact with a molten solder bump on a support circuit, and the solder is reflowed and cooled to form a solder joint around the gold pin. A drawback to this approach is that when the wire bonder forms the gold ball on the pad it applies substantial pressure to the pad which might destroy active circuitry beneath the pad. In addition, gold from the pin can dissolve into the solder to form a gold-tin intermetallic compound which mechanically weakens the pin and therefore reduces reliability.

U.S. Pat. No. 5,722,162 discloses fabricating a pillar by electroplating the pillar on a selected portion of an underlying metal exposed by an opening in photoresist and then stripping the photoresist. Although it is convenient to use photoresist to define the location of the pillar, electroplating the pillar in an opening in the photoresist has certain drawbacks. First, the photoresist is selectively exposed to light that initiates a reaction in regions of the photoresist that correspond to the desired pattern. Since photoresist is not fully transparent and tends to absorb the light, the thicker the photoresist, the poorer the penetration efficiency of the light. As a result, the lower portion of the photoresist might not receive adequate light to initiate or complete the intended photo-reaction. Consequently, the bottom portion of the opening in the photoresist might be too narrow, causing a pillar formed in the narrowed opening to have a diameter that decreases with decreasing height. Such a pillar has a high risk of fracturing at its lower portion in response to thermally induced stress. Furthermore, photoresist residue on the underlying metal might cause the pillar to have poor quality or even prevent the pillar from being formed. Second, if the photoresist is relatively thick (such as 100 microns or more), the photoresist may need to be applied with multiple coatings and receive multiple light exposures and bakes, which increases cost and reduces yield. Third, if the photoresist is relatively thick, the electroplated pillar may be non-uniform due to poor current density distribution in the relatively deep opening. As a result, the pillar may have a jagged or pointed top surface instead of a flat top surface that is better suited for providing a contact terminal for the next level assembly.

In view of the various development stages and limitations in currently available semiconductor chip assemblies, there is a need for a semiconductor chip assembly that is cost-effective, reliable, manufacturable, and provides excellent mechanical and electrical performance.

SUMMARY OF THE INVENTION

An object of the present invention is to provide a semiconductor chip assembly with a chip, a conductive trace and an insulative base that provides a low cost, high performance, high reliability package.

Another object of the present invention is to provide a convenient, cost-effective method for manufacturing semiconductor chip assemblies as column grid arrays or other structures.

In accordance with an aspect of the invention, a method of making a semiconductor chip assembly includes providing a semiconductor chip, a conductive trace and an insulative base, wherein the chip includes a conductive pad and the insulative base contacts the conductive trace on a side opposite the chip, then forming a through-hole that extends through the insulative base and exposes the conductive trace and the pad, and then forming a connection joint that contacts and electrically connects the conductive trace and the pad.

The method may include mechanically attaching the chip to the conductive trace using an insulative adhesive, and then forming the through-hole through the insulative base and the adhesive.

The method may also include providing a laminated structure that includes the conductive trace, the insulative base and a metal base, mechanically attaching the chip to the laminated structure using the adhesive such that the metal base is disposed on a side of the insulative base that faces away from the chip and the conductive trace extends to a side of the insulative base that faces towards the chip, etching the metal base, and then forming the through-hole.

The method may also include providing the conductive trace with a routing line and a pillar, wherein the routing line is disposed on a side of the insulative base that faces towards the chip and overlaps the pad, and the pillar contacts the routing line extends through the insulative base.

The method may also include positioning the conductive trace and the chip such that the routing line extends within and outside a periphery of the chip and the pillar is disposed outside the periphery of the chip.

The method may also include providing a metal layer in contact with the insulative base on a side opposite the metal base, forming a photoresist layer on the metal layer that selectively exposes a portion of the metal layer, etching the metal layer using the photoresist layer as an etch mask such that an unetched portion of the metal layer forms the routing line, and then removing the photoresist layer.

The method may also include forming a via that extends through the insulative base and into the metal base and the metal layer, depositing solder paste into the via, and then reflowing the solder paste to form the pillar which extends through the insulative base and into the metal base and the metal layer.

The method may also include forming a first solder mask on the metal base, mechanically drilling a hole through the first solder mask, the metal base, the insulative base and the metal layer to provide the via, forming a second solder mask on the metal layer that plugs the via, depositing the solder paste into the via, reflowing the solder paste to provide the pillar, and then removing the first and second solder masks.

The method may also include forming the photoresist layer, etching the metal layer to form the routing line and removing the photoresist layer after drilling the hole and before forming the second solder mask.

An advantage of the present invention is that the semiconductor chip assembly includes a conductive trace with an additively formed pillar that can be manufactured conveniently and cost effectively. Another advantage is that the insulative base can be provided before the metal base is etched, thereby enhancing the mechanical support and protection for the conductive trace when the metal base is etched. Another advantage is that the assembly can be manufactured using low temperature processes which reduces stress and improves reliability. A further advantage is that the assembly can be manufactured using well-controlled wet chemical processes which can be easily implemented by circuit board, lead frame and tape manufacturers. Still another advantage is that the assembly can be manufactured using materials that are compatible with copper chip requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
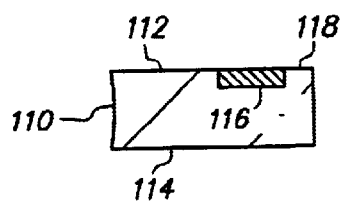
FIGS. 1A–1Q are cross-sectional views showing a method of making a semiconductor chip assembly in accordance with an embodiment of the present invention.
Figure 2A:
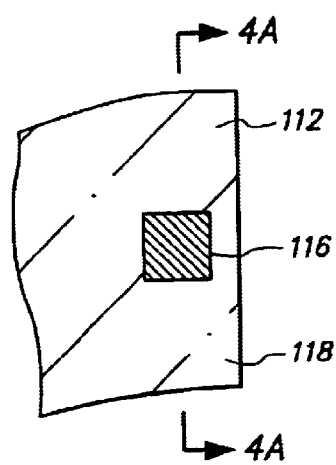
FIGS. 2A–2Q are top plan views corresponding to FIGS. 1A–1Q, respectively.
Figure 3A:
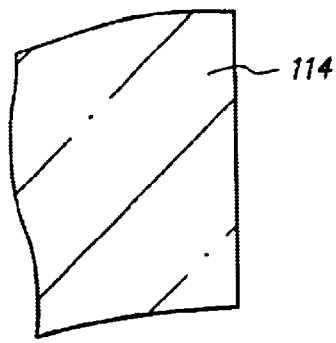
FIGS. 3A–3Q are bottom plan views corresponding to FIGS. 1A–1Q, respectively.
Figure 1B:
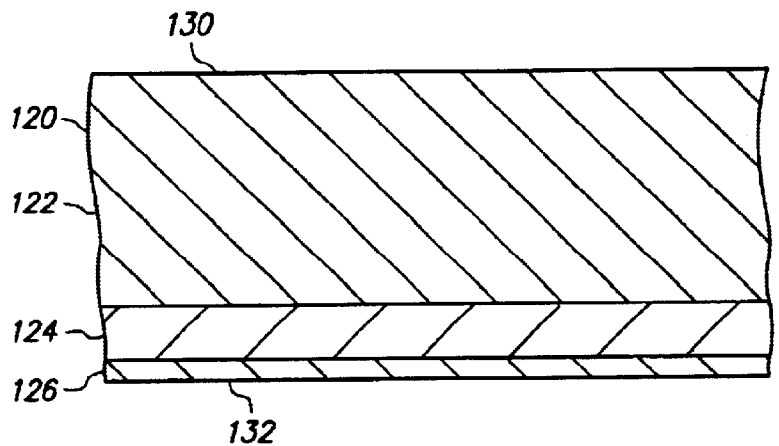
Figure 2B:
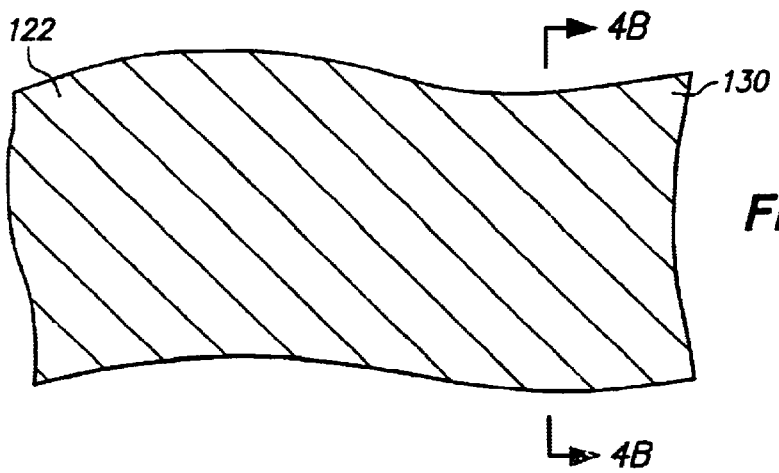
Figure 3B:
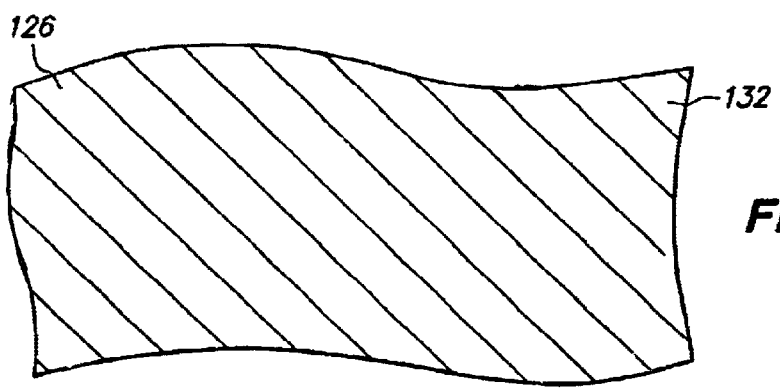
Figure 1C:
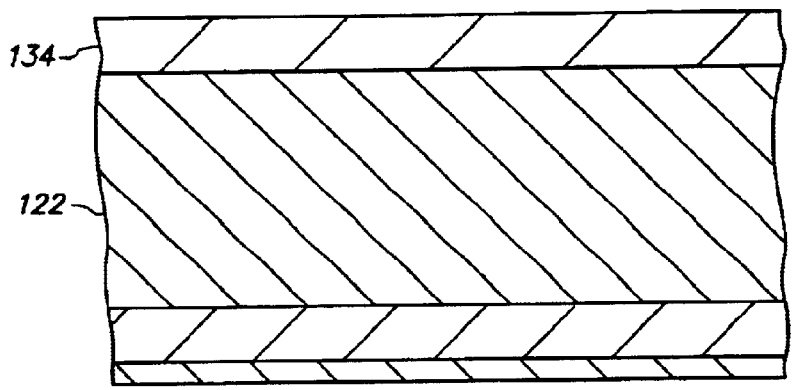
Figure 2C:
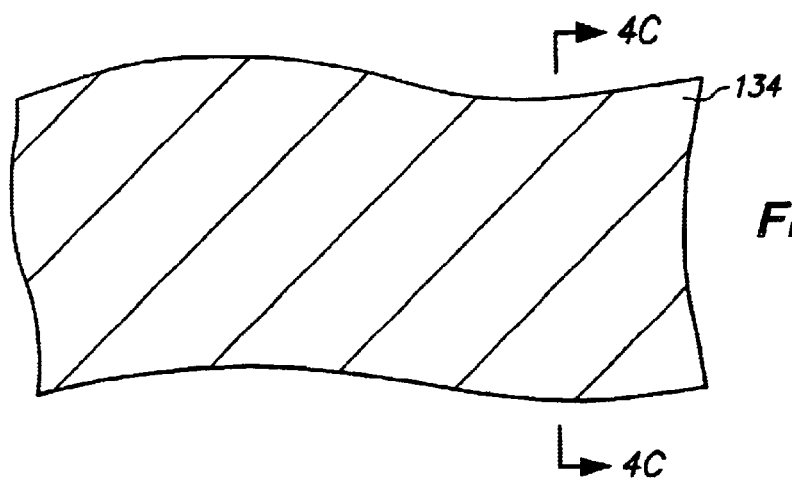
Figure 3C:
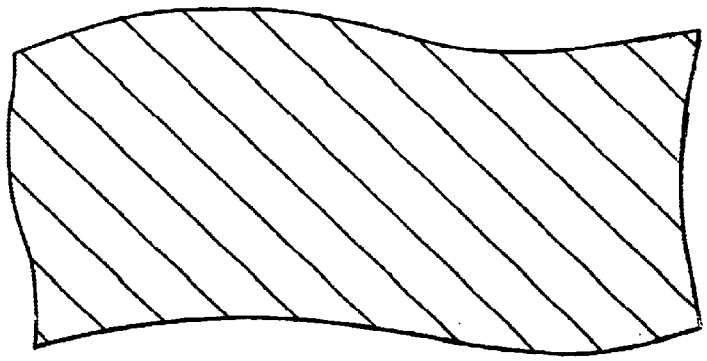
Figure 1D:
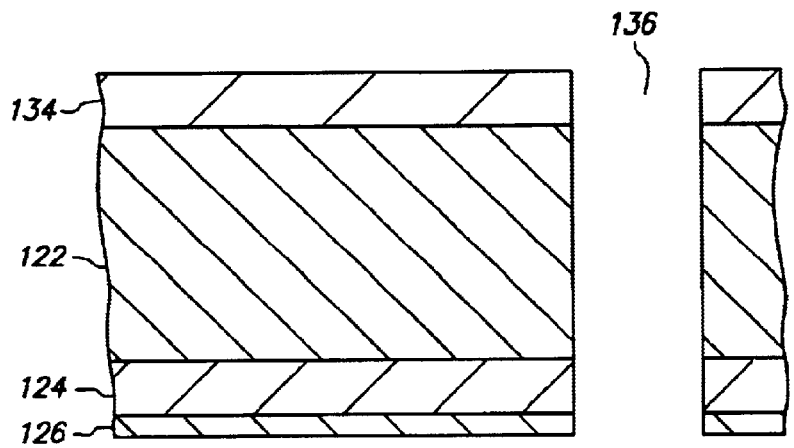
Figure 2D:
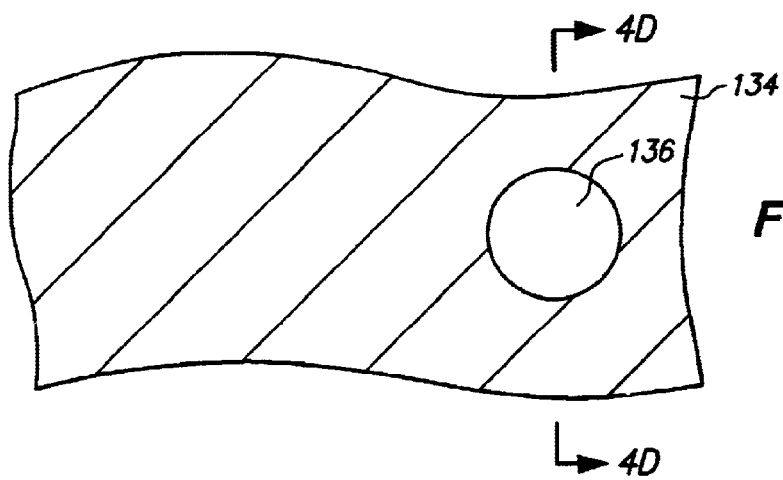
Figure 3D:
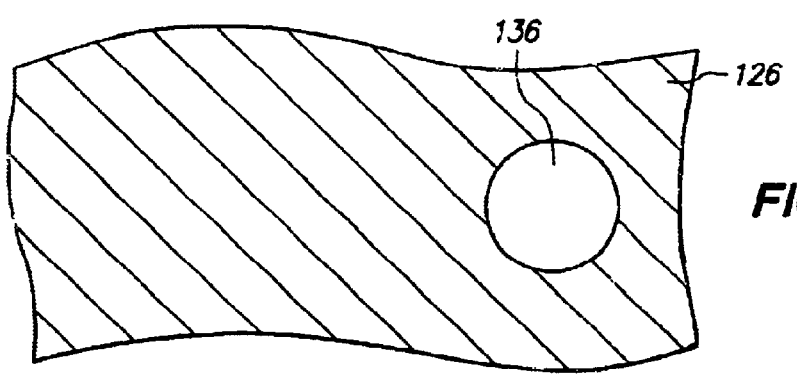
Figure 1E:
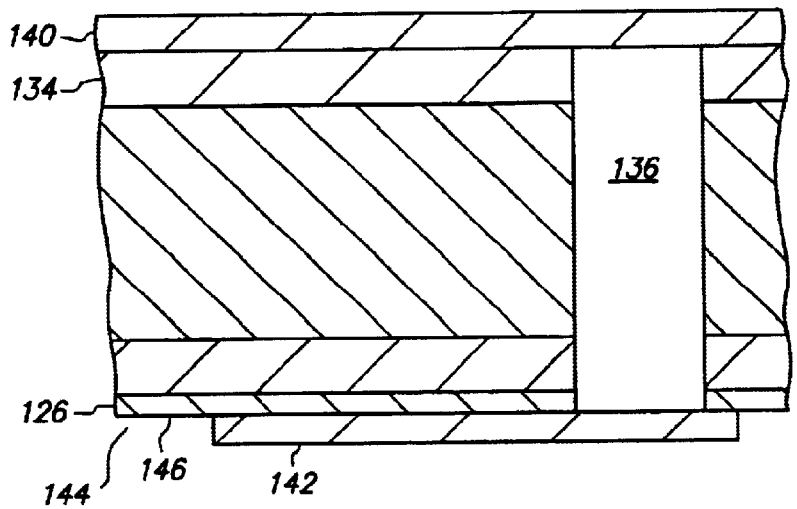
Figure 2E:
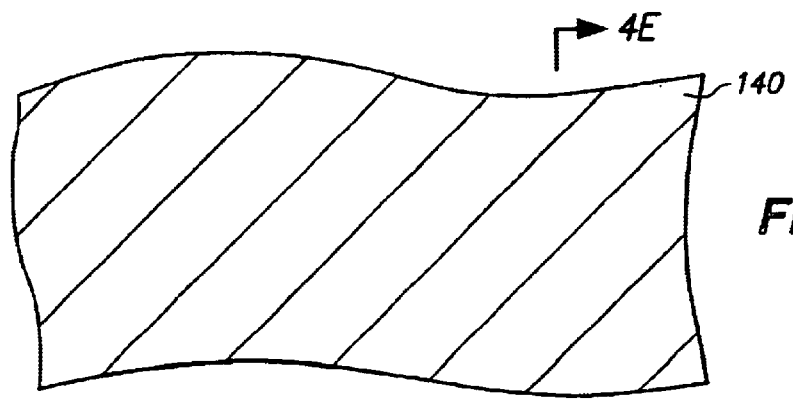
Figure 3E:
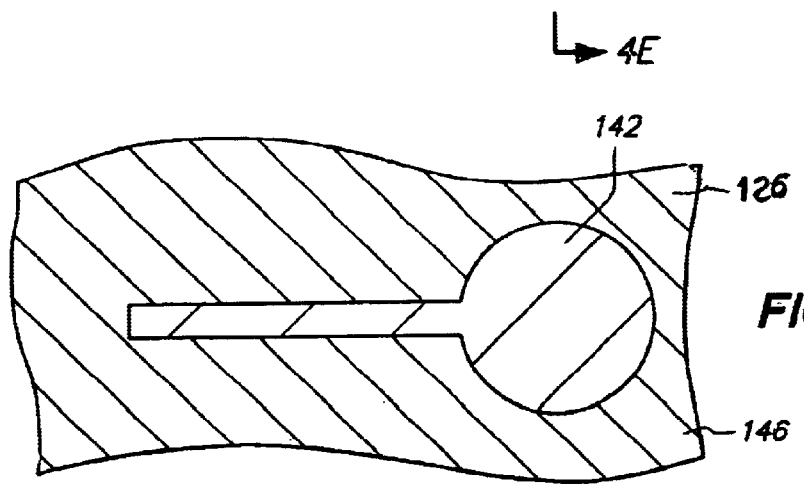
Figure 1F:
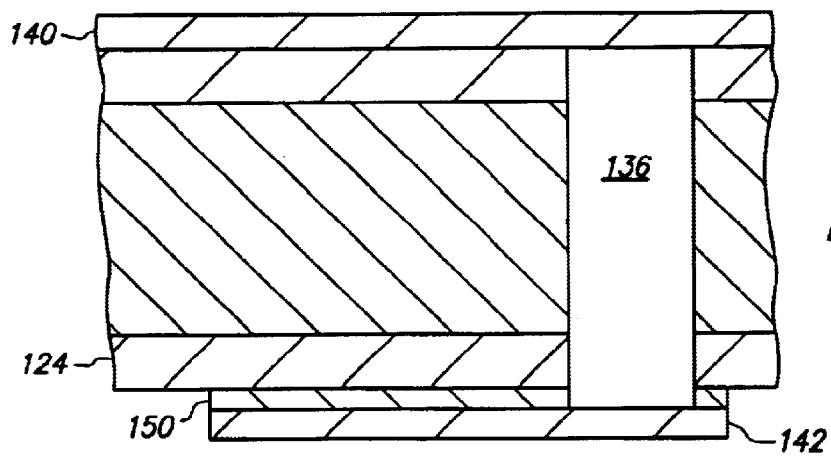
Figure 2F:
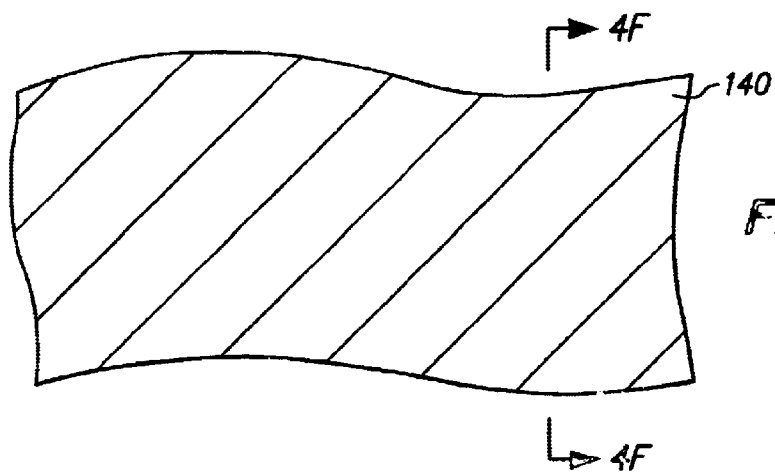
Figure 3F:
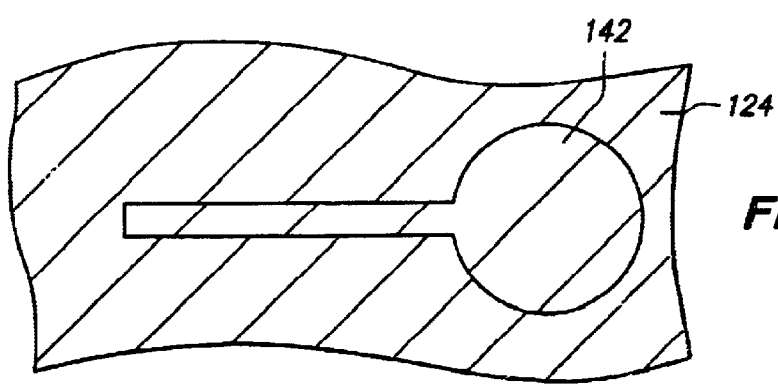
Figure 1G:
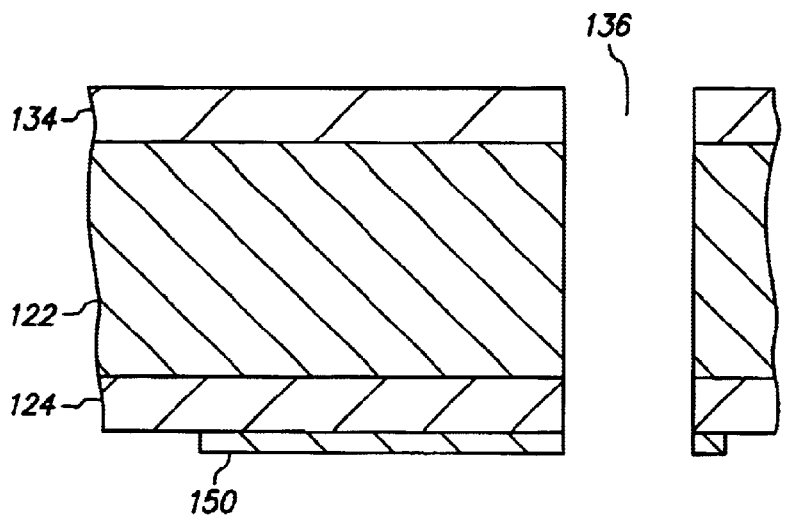
Figure 2G:
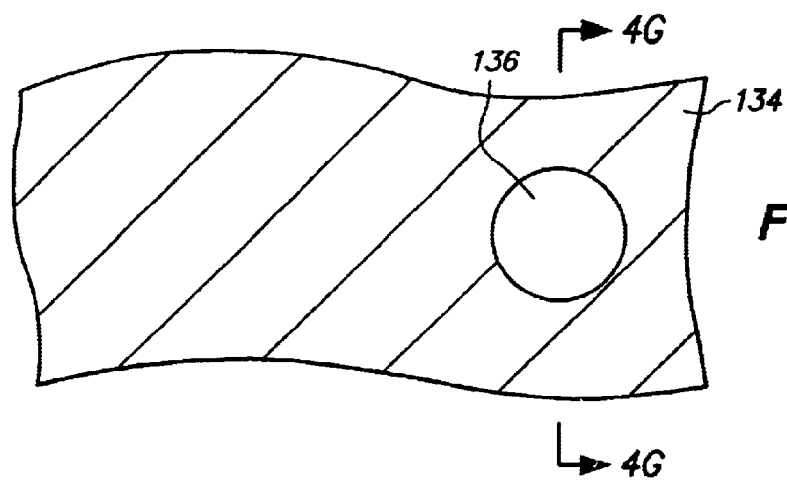
Figure 3G:
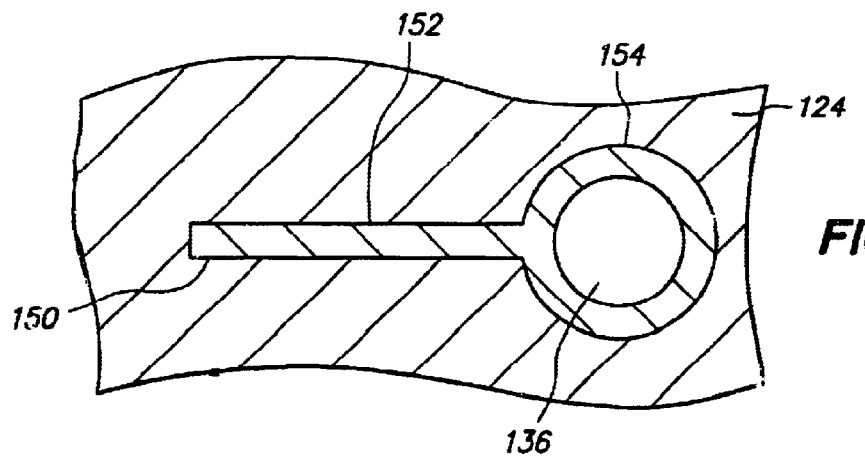
Figure 1H:
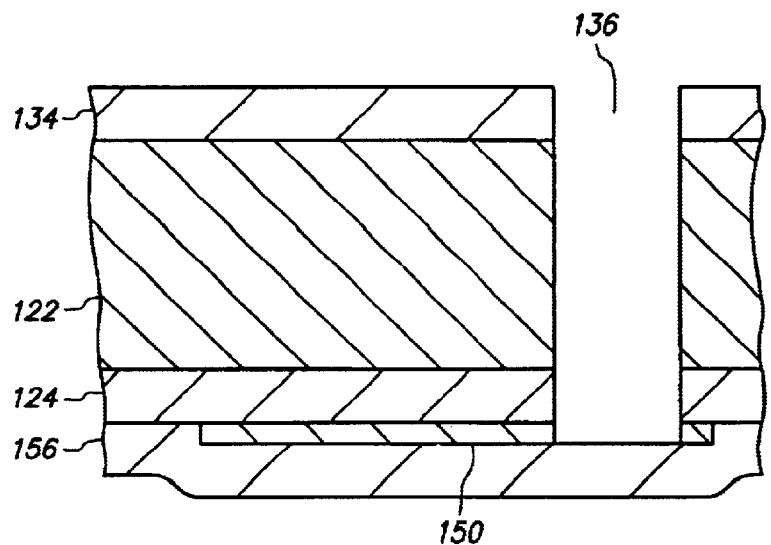
Figure 2H:
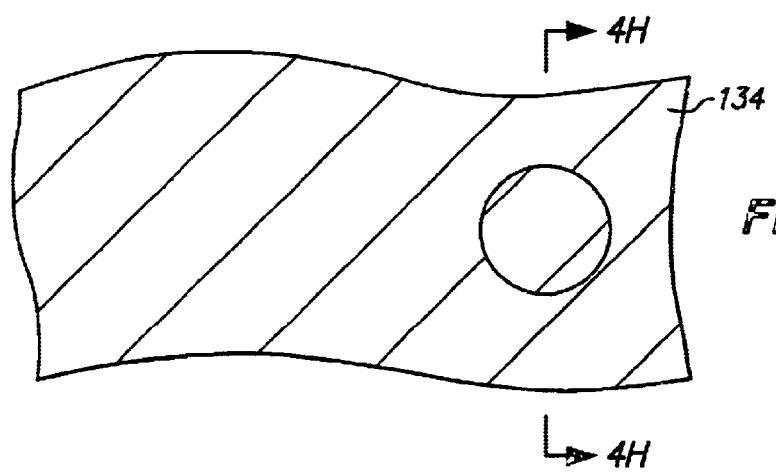
Figure 3H:
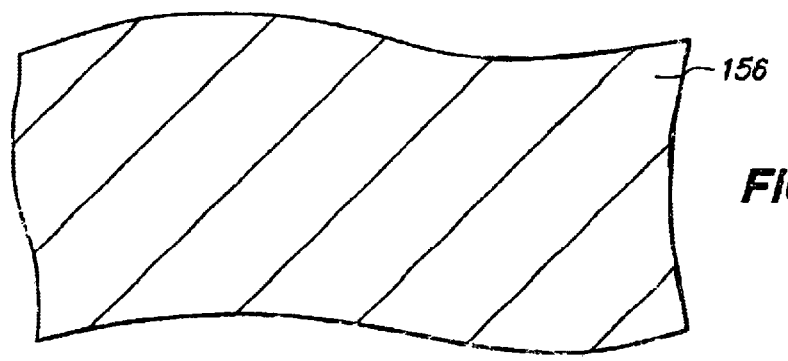
Figure 1I:
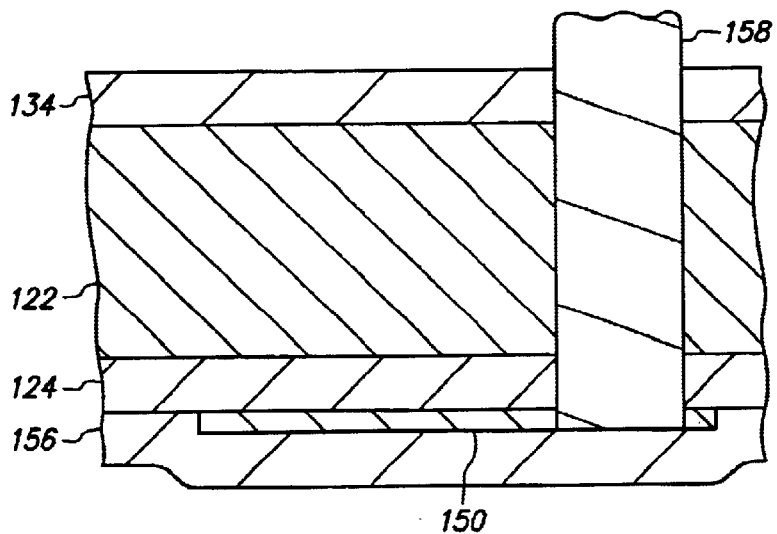
Figure 2I:
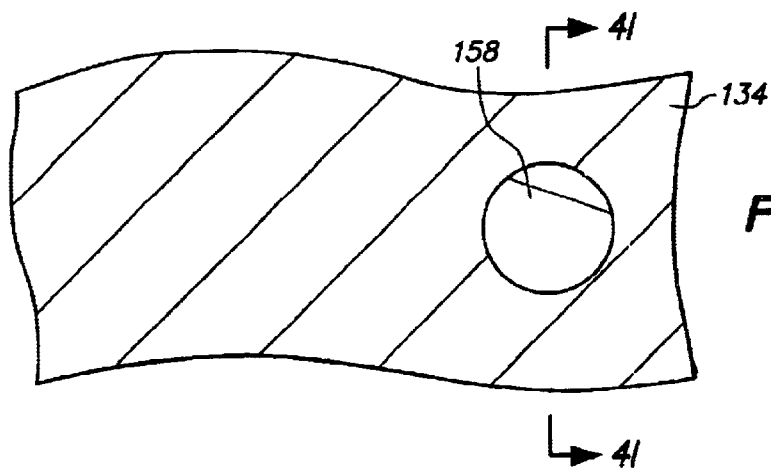
Figure 3I:
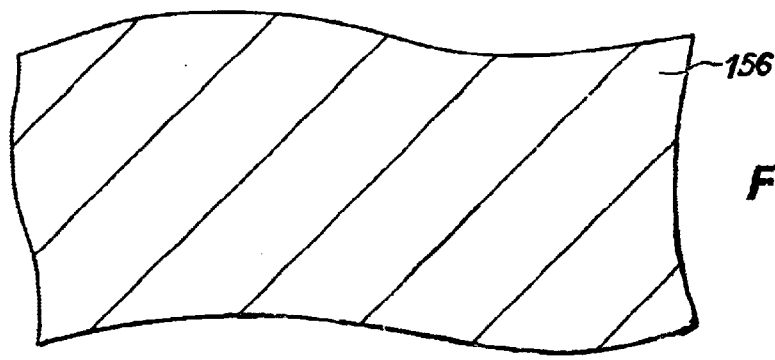
Figure 1J:
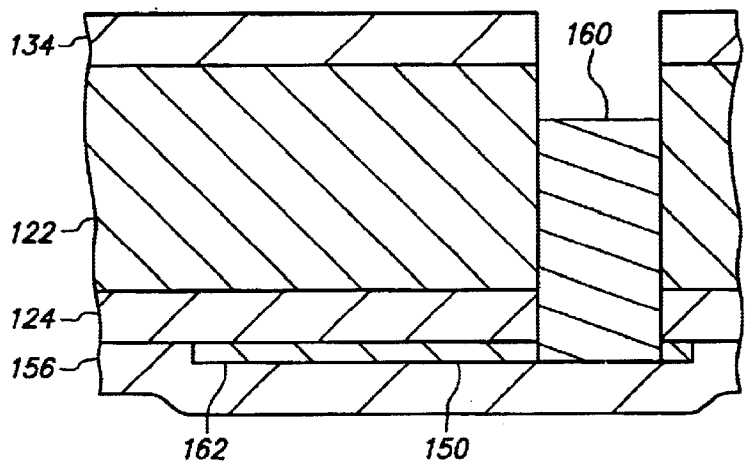
Figure 2J:
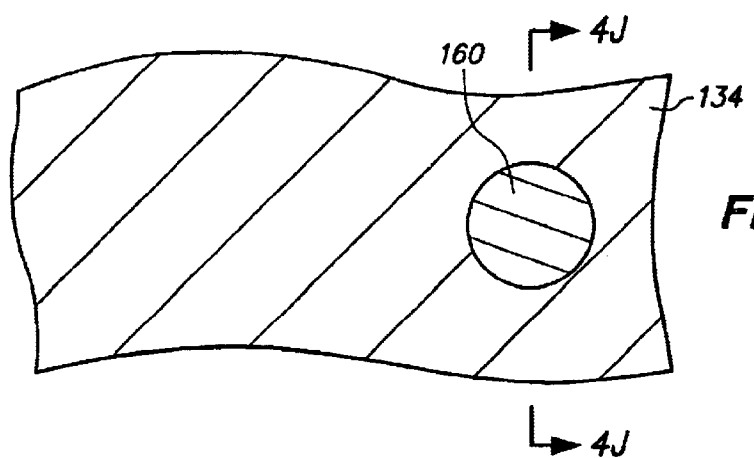
Figure 3J:
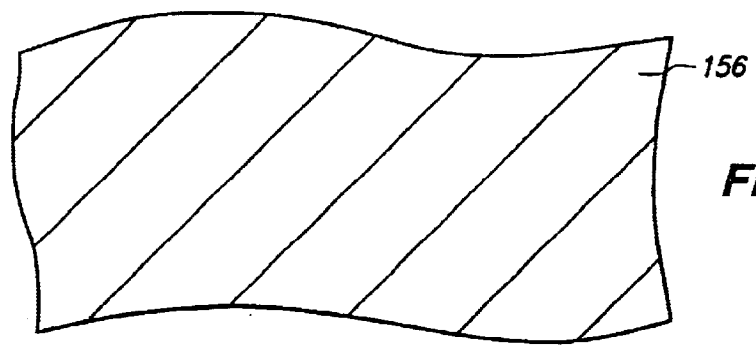
Figure 1K:
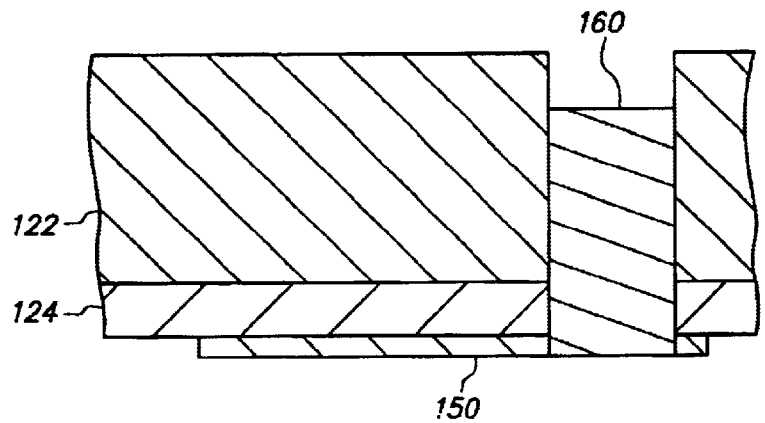
Figure 2K:
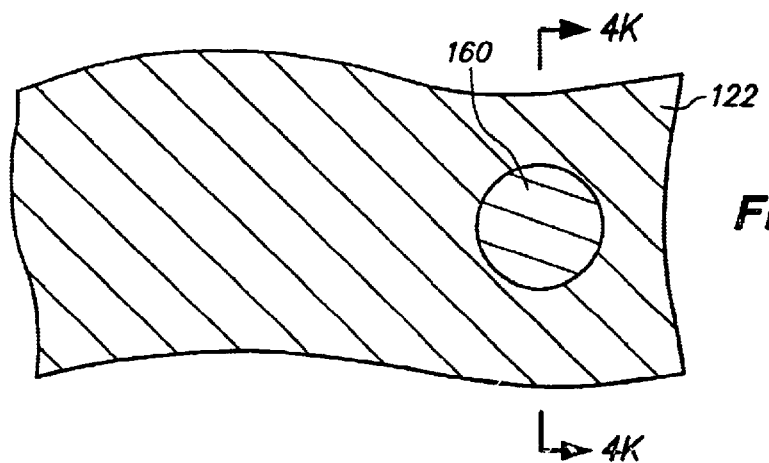
Figure 3K:
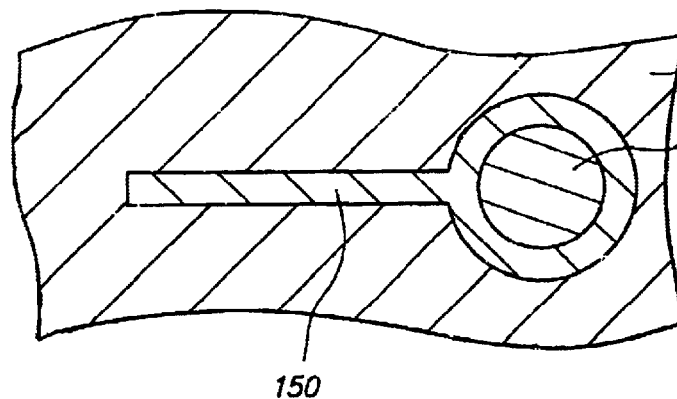
Figure 1L:
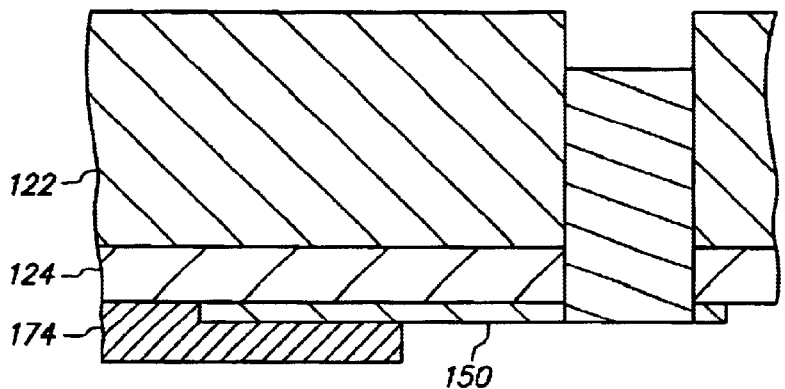
Figure 2L:
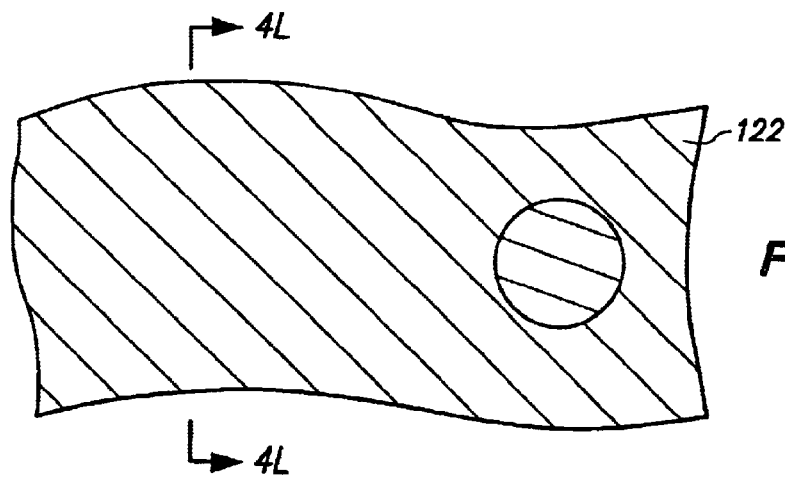
Figure 3L:
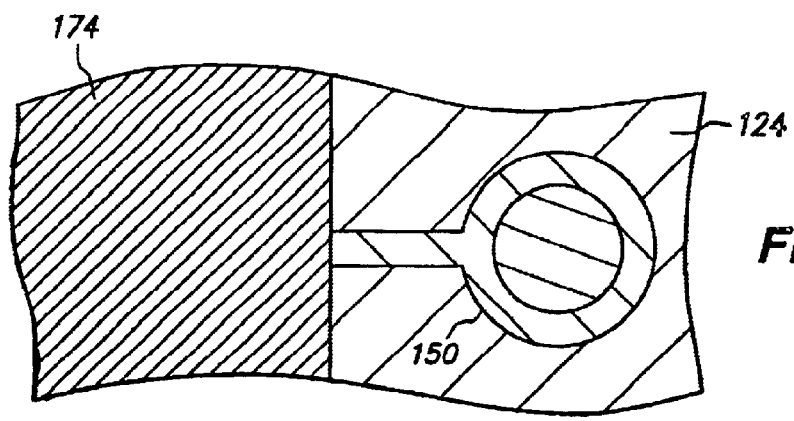
Figure 1M:
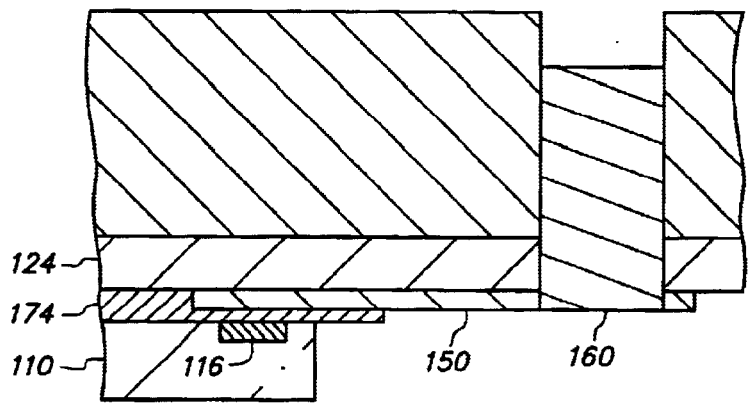
Figure 2M:
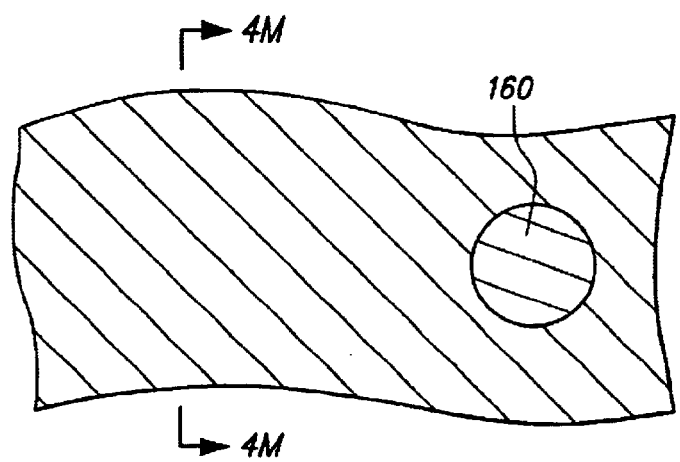
Figure 3M:
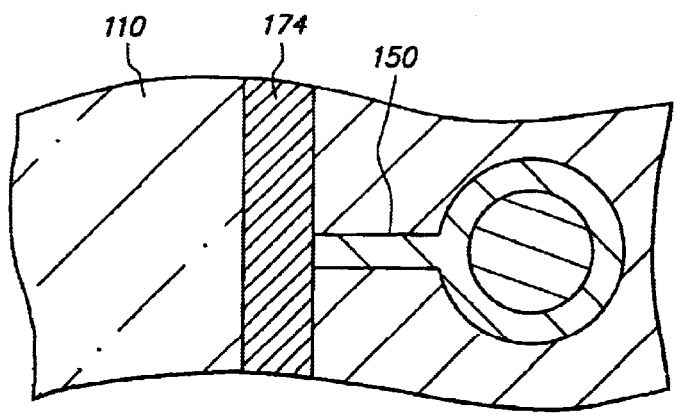
Figure 1N:
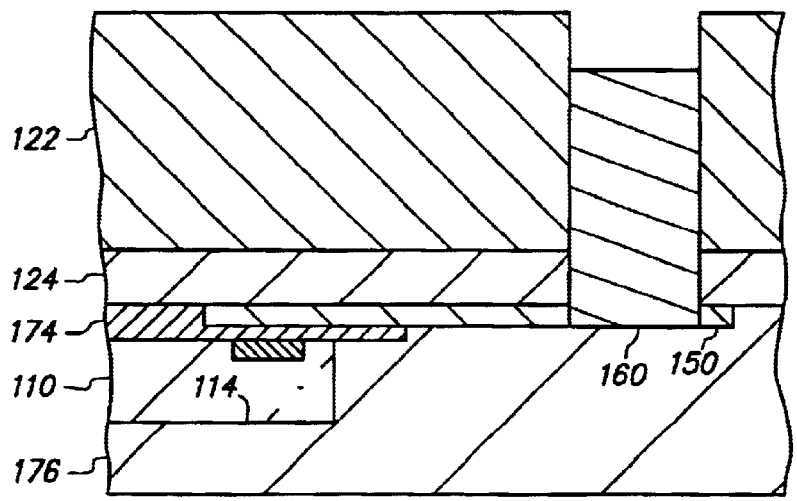
Figure 2N:
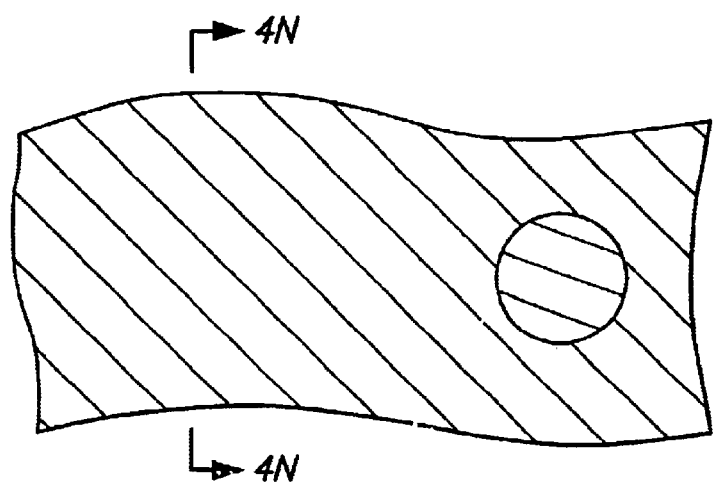
Figure 3N:
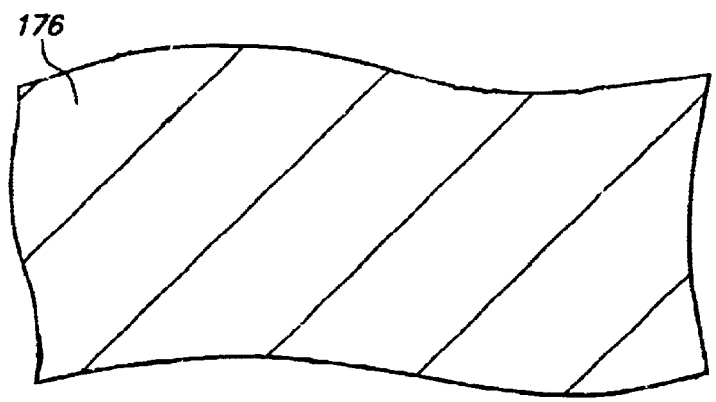
Figure 1O:
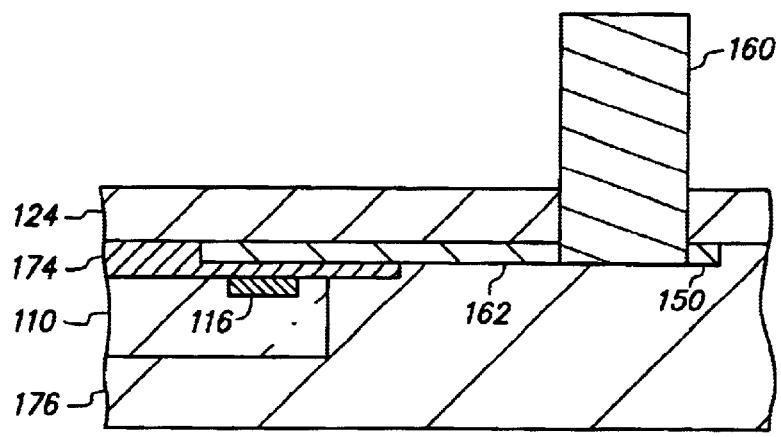
Figure 2O:
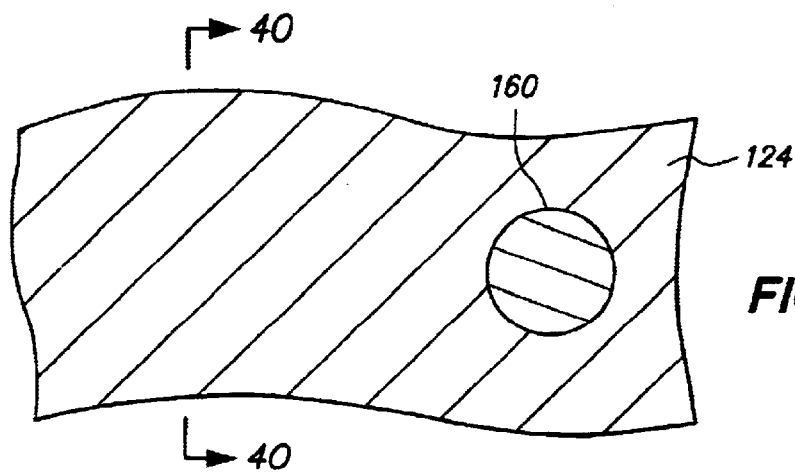
Figure 3O:
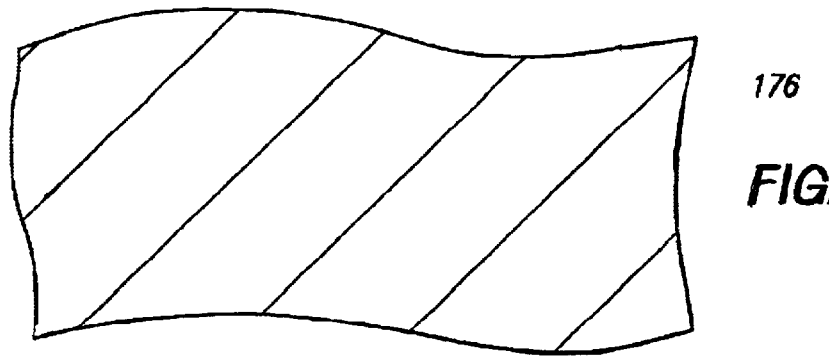
Figure 1P:
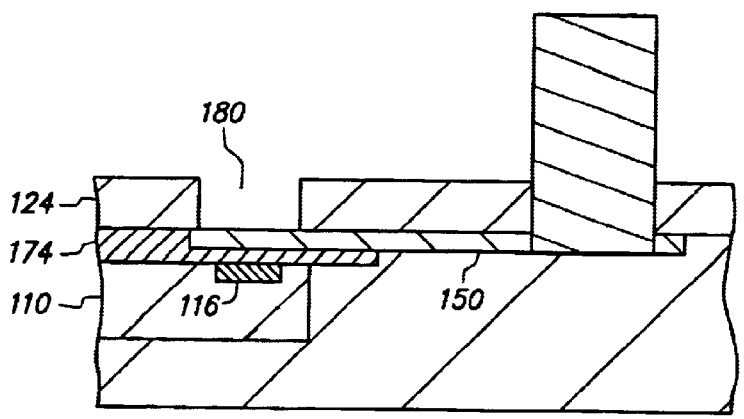
Figure 2P:
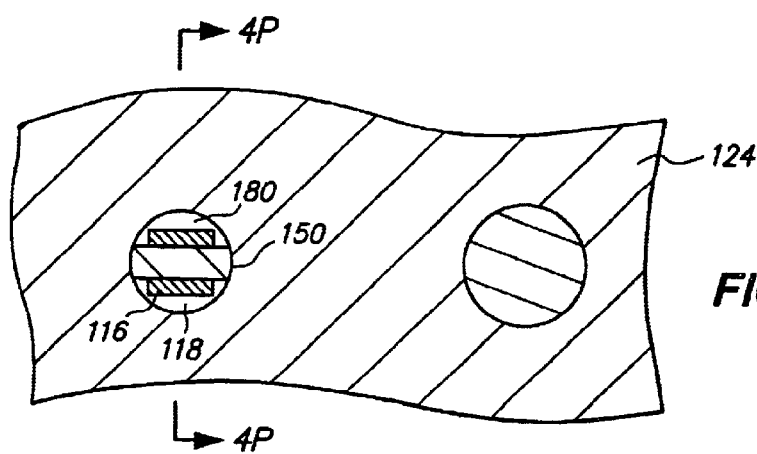
Figure 3P:
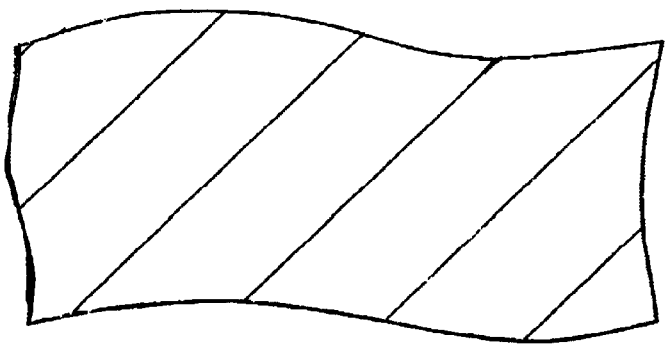
Figure 1Q:
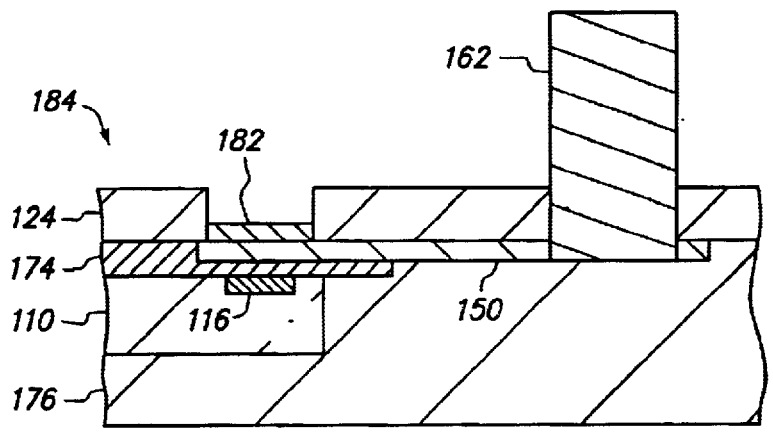
Figure 2Q:
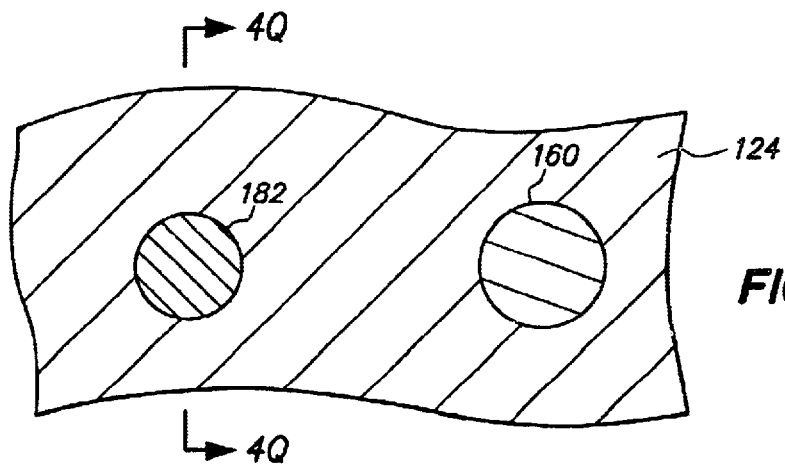
Figure 3Q:
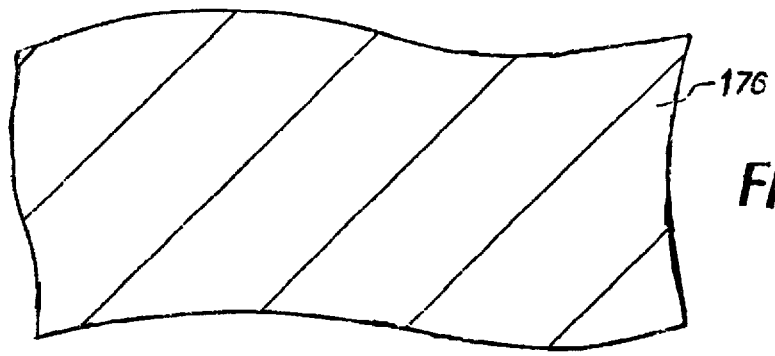
Figure 4A:
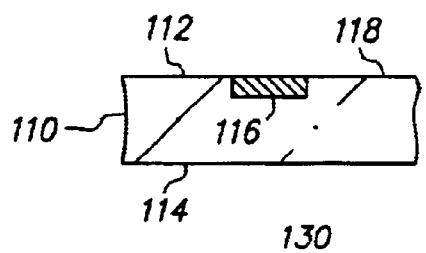
FIGS. 4A–4Q are cross-sectional views corresponding to FIGS. 1A–1Q, respectively.
Figure 4B:
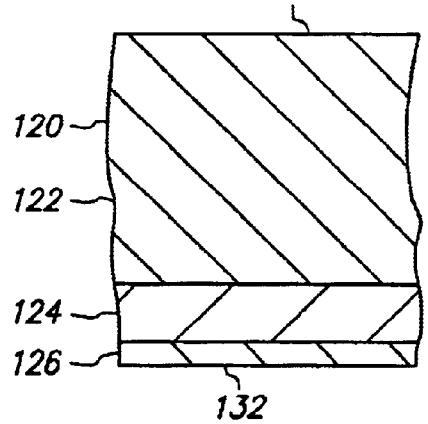
Figure 4C:
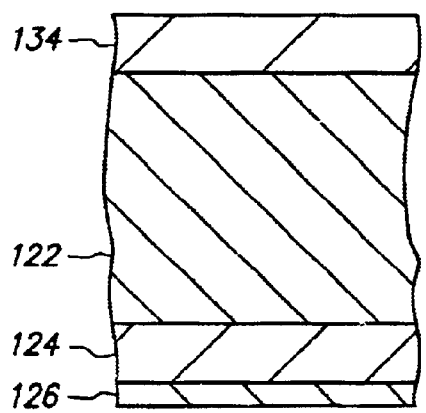
Figure 4D:
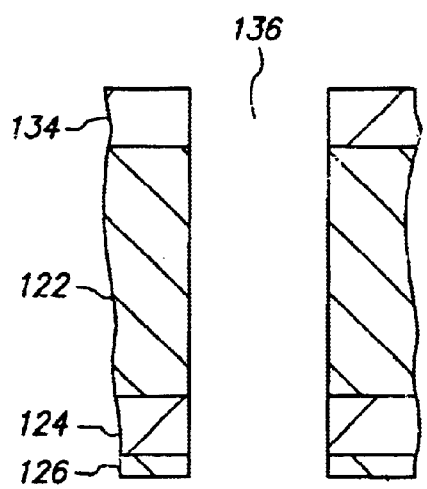
Figure 4E:
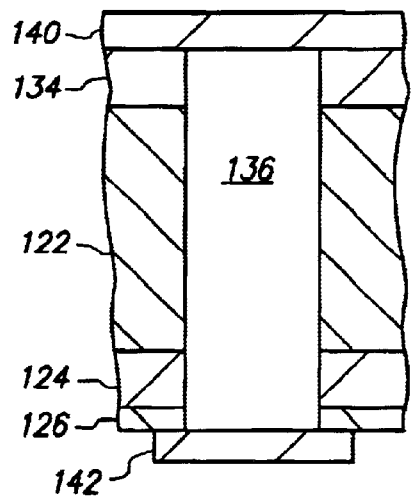
Figure 4F:
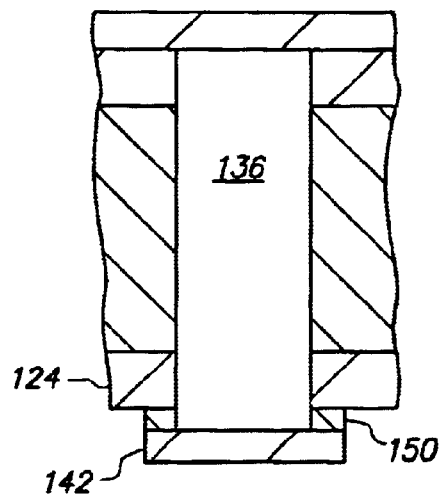
Figure 4G:
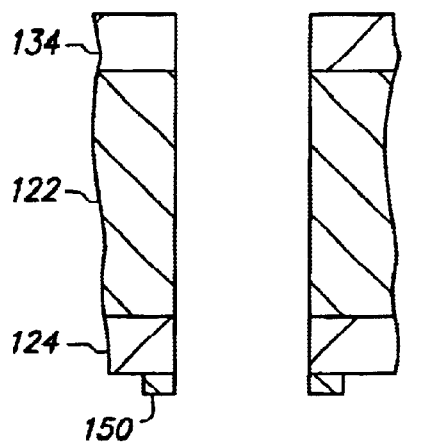
Figure 4H:
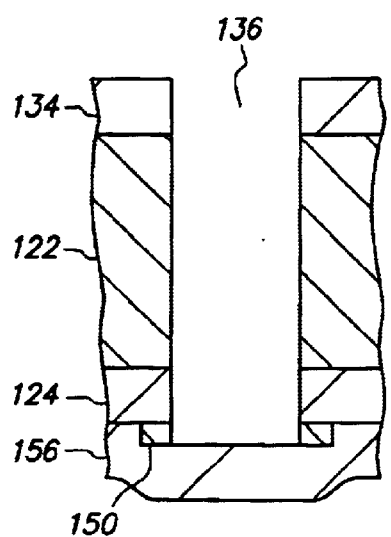
Figure 4I:
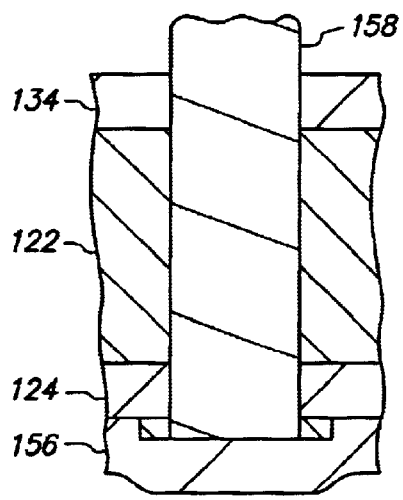
Figure 4J:
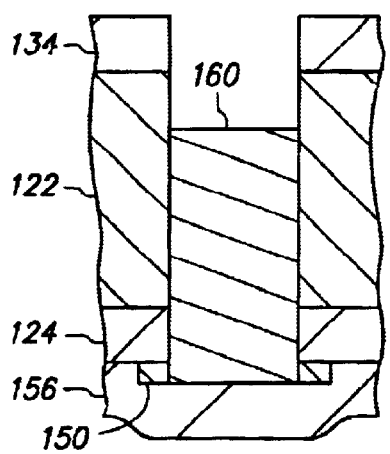
Figure 4K:
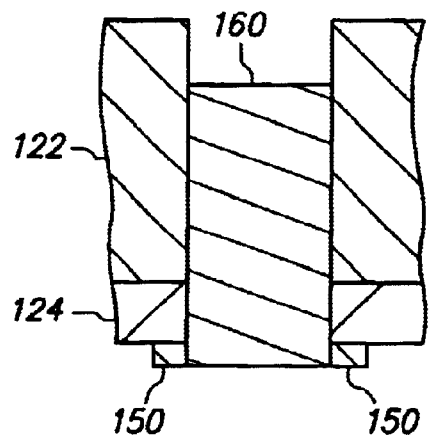
Figure 4L:
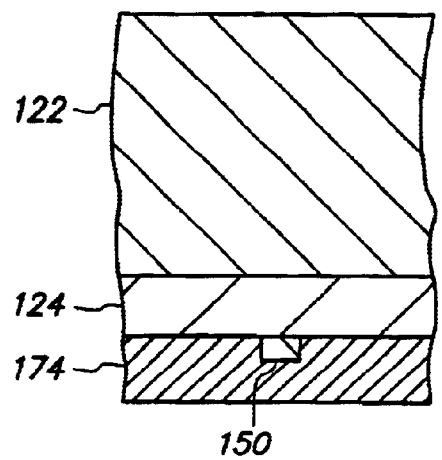
Figure 4M:
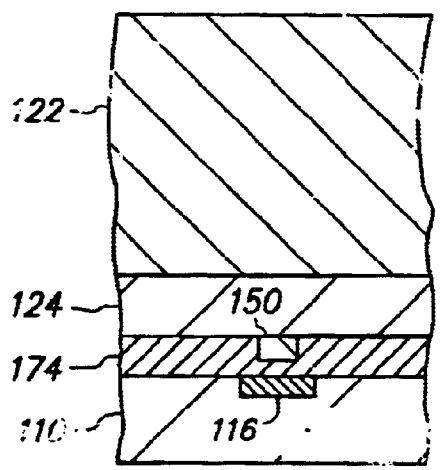
Figure 4N:
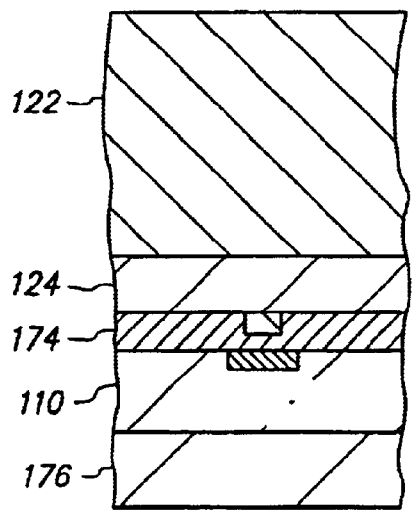
Figure 4O:
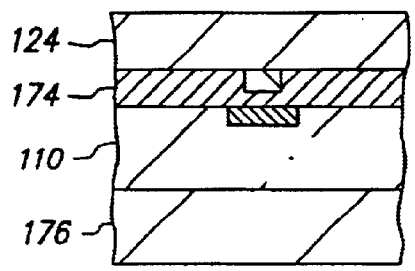
Figure 4P:
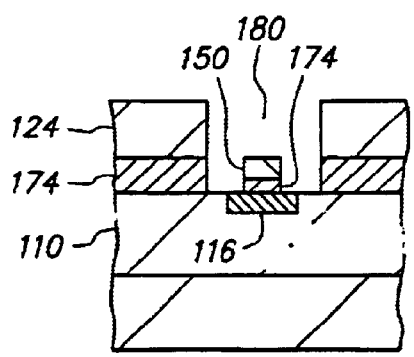
Figure 4Q:
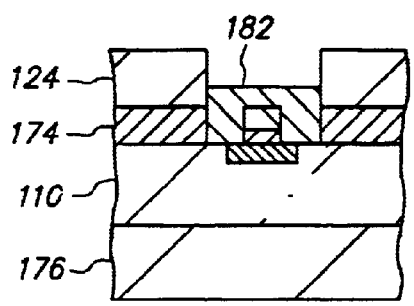

FIGS. 1A–1Q, 2A–2Q, 3A–3Q and 4A–4Q are cross-sectional, top, bottom and cross-sectional views, respectively, of a method of making a semiconductor chip assembly in accordance with an embodiment of the present invention. FIGS. 4A–4Q are oriented orthogonally with respect to FIGS. 1A–1Q and depict FIGS. 1A–1Q as viewed from left-to-right.

FIGS. 1A, 2A, 3A and 4A are cross-sectional, top, bottom and cross-sectional views, respectively, of semiconductor chip 110 which is an integrated circuit in which various transistors, circuits, interconnect lines and the like are formed (not shown). Chip 110 includes opposing major surfaces 112 and 114 and has a thickness of 200 microns between these surfaces. Surface 112 includes conductive pad 116 and passivation layer 118. Pad 116 is substantially aligned with passivation layer 118 so that surface 112 is essentially flat. Alternatively, if desired, pad 116 can extend above or be recessed below passivation layer 118. Pad 116 provides a bonding site to electrically couple chip 110 with external circuitry. Thus, pad 116 can be an input/output pad or a power/ground pad. Pad 116 has a length and width of 70 microns.

Pad 116 has an aluminum base that is cleaned by dipping chip 110 in a solution containing 0.05 M phosphoric acid at room temperature for 1 minute and then rinsed in distilled water.

Chip 110 includes many other pads on surface 112, and only pad 116 is shown for convenience of illustration. In addition, chip 110 has already been singulated from other chips that it was previously attached to on a wafer.

FIGS. 1B, 2B, 3B and 4B are cross-sectional, top, bottom and cross-sectional views, respectively, of laminated structure 120 which includes metal base 122, insulative base 124 and metal layer 126. Laminated structure 120 also includes opposing major surfaces 130 and 132 at metal base 122 and metal layer 126, respectively. Thus, laminated structure 120 is a diclad laminate in which insulative base 124 adhesively attaches metal base 122 and metal layer 126, and metal base 122 and metal layer 126 are separated from one another. Metal base 122 is a copper foil with a thickness of 125 microns, insulative base 124 is a thermoplastic polyimide layer with a thickness of 25 microns, and metal layer 126 is a copper foil with a thickness of 12 microns.

FIGS. 1C, 2C, 3C and 4C are cross-sectional, top, bottom and cross-sectional views, respectively, of solder mask 134 formed on metal base 122. Solder mask 134 is initially an epoxy paste that is coated onto surface 130 using screen printing. The epoxy paste includes an epoxy resin, a curing agent and an accelerator. Thereafter, the epoxy paste is cured or hardened at a relatively low temperature in the range of 100–250° C. to form solder mask 134 as solid adherent layer with a thickness of 25 microns.

FIGS. 1D, 2D, 3D and 4D are cross-sectional, top, bottom and cross-sectional views, respectively, of via 136 formed in laminated structure 120 and solder mask 134. Via 136 is an opening formed by mechanical drilling that extends through solder mask 134, metal base 122, insulative base 124 and metal layer 126. Via 136 has a diameter of 300 microns.

FIGS. 1E, 2E, 3E and 4E are cross-sectional, top, bottom and cross-sectional views, respectively, of photoresist layers 140 and 142 formed on solder mask 134 and metal layer 126, respectively. Photoresist layers 140 and 142 are deposited using a dry film lamination process in which hot rolls simultaneously press photoresist layers 140 and 142 onto the respective surfaces. A reticle (not shown) is positioned proximate to photoresist layer 142 using via 136 as a registration point so that the reticle is precisely located relative to via 136. Thereafter, photoresist layer 142 is patterned by selectively applying light through the reticle, applying a developer solution to remove the photoresist portions rendered soluble by the light, and then hard baking, as is conventional. As a result, photoresist layer 142 contains opening 144 that selectively exposes portion 146 of surface 132, and photoresist layer 140 remains unpatterned. Photoresist layers 140 and 142 each have a thickness of 15 microns.

FIGS. 1F, 2F, 3F and 4F are cross-sectional, top, bottom and cross-sectional views, respectively, of routing line 150 formed in metal layer 126. Routing line 150 is formed by applying a wet chemical etch to metal layer 126 using photoresist layer 142 as an etch mask. The wet chemical etch etches completely through metal layer 126, thereby effecting a pattern transfer of photoresist layer 142 onto metal layer 126. The wet chemical etch is highly selective of copper with respect to polyimide, and therefore, after the wet chemical etch etches through portion 146 of metal layer 126 and contacts insulative base 124, no appreciable amount of insulative base 124 is removed. Thus, routing line 150 is formed subtractively and constitutes a remaining portion of metal layer 126 after the wet chemical etch is applied. Furthermore, photoresist layers 140 and 142 prevent the wet chemical etch from entering via 136.

A suitable wet chemical etch can be provided by a solution containing alkaline ammonia, sulfuric acid with hydrogen peroxide, chromic-sulfuric acid, phosphoric acid with ammonium persulfate, copper sulfate, copper chloride or ferric chloride. The optimal etch time for exposing the structure to the wet chemical etch in order to form routing line 150 with a negligible undercut can be established through trial and error.

FIGS. 1G, 2G, 3G and 4G are cross-sectional, top, bottom and cross-sectional views, respectively, of laminated structure 120 after photoresist layers 140 and 142 are stripped. Photoresist layers 140 and 142 are removed using a solvent, such as a mild alkaline solution with a pH of 9, that is highly selective of photoresist with respect to copper, polyimide and epoxy. Therefore, no appreciable amount of metal base 122, insulative base 124, solder mask 134 or routing line 150 is removed.

Routing line 150 includes an elongated routing region 152 with a width (orthogonal to its elongated length) of 30 microns, and an enlarged circular region 154 with a diameter of 500 microns. Via 136 is axially centered within enlarged circular region 154. Thus, via 136 has sidewalls that are laterally spaced from the outer edges of enlarged circular region 154 by 100 microns ((500−300)/2).

FIGS. 1H, 2H, 3H and 4H are cross-sectional, top, bottom and cross-sectional views, respectively, of solder mask 156 formed on routing line 150. Solder mask 156 also contacts insulative base 124 outside routing line 150. Solder mask 156 is deposited on routing line 150 as a dry film and then cured to provide an adherent epoxy layer with a thickness of 25 microns. Of importance, solder mask 156 plugs via 136 at routing line 150 without entering the portion of via 136 that extends through routing line 150. As a result, solder mask 156 converts via 136 into a blind via that extends through solder mask 134, metal base 122, insulative base 124 and routing line 150, but does not extend into solder mask 156.

FIGS. 1I, 2I, 3I and 4I are cross-sectional, top, bottom and cross-sectional views, respectively, of solder paste 158 deposited into via 136. Solder paste 158 includes finely powdered tin-lead solder particles mixed in a viscous organic resin containing a fluxing agent. Solder paste 158 is deposited into via 136 using stencil printing. During the stencil printing process, a stencil (not shown) is placed on solder mask 134 and a stencil opening is aligned with via 136, and then a squeegee (not shown) pushes solder paste 158 along the surface of the stencil opposite solder mask 134, through the stencil opening and into via 136. Solder paste 158 fills via 136 and vertically extends above via 136 by the 50 micron thickness of the stencil. Solder paste 158 is compliant enough at room temperature to conform to virtually any shape. Thus, solder paste 158 fills via 136 and contacts solder mask 134, metal base 122, insulative base 124, routing line 150 and solder mask 156. Since solder mask 156 plugs via 136, solder paste 158 is contained within via 136.

FIGS. 1J, 2J, 3J and 4J are cross-sectional, top, bottom and cross-sectional views, respectively, of pillar 160 formed by solder reflow. Pillar 160 is formed in via 136 and contacts metal base 122, insulative base 124, routing line 150 and solder mask 156. In particular, pillar extends into but not through metal base 122, extends through insulative base 124, and extends through routing line 150. Furthermore, pillar 160 adheres to and is electrically connected to metal base 122 and routing line 150. However, solder mask 134 prevents pillar 160 or solder particles from contacting surface 130 of metal base 122, and likewise, solder mask 156 prevents pillar 160 or solder particles from contacting surface 132 of routing line 150.

Pillar 160 is formed by heating solder paste 158 to a temperature of about 210° C. The heat causes the flux in solder paste 158 to react with and remove oxides from metal base 122 and routing line 150 and the solder particles in solder paste 158, renders the solder particles in solder paste 158 molten such that they coalesce and wet metal base 122 and routing line 150, and vaporizes the organic resin in solder paste 158. As a result, solder paste 158 is reduced to roughly one-half its original size and solder reflow occurs. Thereafter, the heat is removed and the molten solder particles cool and solidify into a hardened solder joint that provides pillar 160. In this manner, the heat transforms non-solidified solder paste 158 into hardened solder pillar 160.

Solder paste 158 has a height of about 237 microns (50+25+125+25+12) before the reflow operation. Therefore pillar 160, which occupies about one-half the volume of solder paste 158, has a height of about 118 microns (237/2). As a result, pillar 160 contains a lower portion that extends through insulative base 124 and routing line 150 and an upper portion that extends about 81 microns (118−25−12) beyond insulative base 124 into metal base 122. These calculations use approximations and rounding for convenience of explanation.

The combination of routing line 150 and pillar 160 provides conductive trace 162 that is adapted for providing horizontal and vertical routing between pad 116 and a terminal on a printed circuit board (not shown) in a next level assembly.

FIGS. 1K, 2K, 3K and 4K are cross-sectional, top, bottom and cross-sectional views, respectively, of laminated structure 120 and pillar 160 after solder masks 134 and 156 are stripped. Solder masks 134 and 156 are removed by applying a solvent that is highly selective of epoxy with respect to copper, polyimide and solder. Therefore, no appreciable amount of metal base 122, insulative base 124, routing line 150 or pillar 160 is removed.

FIGS. 1L, 2L, 3L and 4L are cross-sectional, top, bottom and cross-sectional views, respectively, of adhesive 174 formed on insulative base 124 and routing line 150. Adhesive 174 may include an organic surface protectant such as HK 2000 which is promptly applied to the structure after the solder masks are stripped to reduce native oxide formation on the exposed copper surfaces. The use of organic surface protectant layers in insulative adhesives for semiconductor chip assemblies is well-known in the art. Thereafter, a liquid resin (A stage) such as polyamic acid is applied over a predetermined portion of the structure using stencil printing. The liquid resin flows over insulative base 124 and routing line 150. Adhesive 174 has a thickness of 30 microns as measured from insulative base 124 outside routing line 124. However, adhesive 174 does not contact metal base 122.

For convenience of illustration, adhesive 174 is shown below insulative base 124 to retain a single orientation throughout the figures for ease of comparison between the figures, although in this step the structure would be inverted so that gravitational force would assist the liquid resin flow.

FIGS. 1M, 2M, 3M and 4M are cross-sectional, top, bottom and cross-sectional views, respectively, of chip 110 mechanically attached to laminated structure 120 by adhesive 174. Adhesive 174 is disposed between and contacts chip 110 and insulative base 124, and likewise, adhesive 174 is disposed between and contacts chip 110 and routing line 150. Thus, chip 110 and insulative base 124 do not contact one another, and chip 110 and routing line 150 do not contact one another.

Chip 110 and laminated structure 120 are positioned relative to one another so that chip 110 is disposed within the surface area of adhesive 174, routing line 150 is disposed above and overlaps and is electrically isolated from pad 116, routing line 150 extends within and outside the periphery of chip 110, and pillar 160 is disposed outside the periphery of chip 110. Chip 110 and laminated structure 120 can be aligned using an automated pattern recognition system. Adhesive 174 is sandwiched between chip 110 and laminated structure 120 using relatively low pressure. Thereafter, adhesive 174 is heated and fully cured (C stage) at relatively low temperature in the range of 200 to 250° C. to form a solid adhesive electrically insulative thermosetting polyimide layer that mechanically fastens chip 110 to laminated structure 120. Adhesive 174 is 3 microns thick between pad 116 and routing line 150.

FIGS. 1N, 2N, 3N and 4N are cross-sectional, top, bottom and cross-sectional views, respectively, of encapsulant 176 formed on chip 110, insulative base 124, routing line 150 and adhesive 174 by transfer molding. Transfer molding is the most popular chip encapsulation method for essentially all plastic packages. Generally speaking, transfer molding involves forming components in a closed mold from a molding compound that is conveyed under pressure in a hot, plastic state from a central reservoir called the transfer pot through a tree-like array of runners and gates into closed cavities. Molding compounds are well-known in the art. Encapsulant 176 contacts surface 114 of chip 110, the outer edges of chip 110, and surfaces of insulative base 124, routing line 150, pillar 160 and adhesive 174 that face towards and are outside the periphery of chip 110 without contacting metal base 122. Encapsulant 176 is a solid adherent compressible protective layer that provides backside environmental protection such as moisture resistance and particle protection for chip 110 as well as mechanical support for insulative base 124, routing line 150 and pillar 160 outside the periphery of chip 110. Encapsulant 176 is 100 microns thick beyond surface 114.

FIGS. 1O, 2O, 3O and 4O are cross-sectional, top, bottom and cross-sectional views, respectively, of the structure after metal base 122 is removed by wet chemical etching. The wet chemical etch can be sprayed on metal base 122, or the structure can be dipped in the wet chemical etch since chip 110 and routing line 150 are protected by insulative base 124 and encapsulant 176. A suitable wet chemical etch can be provided by the same solution used for etching metal layer 126 to form routing line 150. The wet chemical etch is highly selective of copper with respect to solder, polyimide and the molding compound. Therefore, no appreciable amount of insulative base 124, pillar 160 or encapsulant 176 is removed. The optimal etch time for exposing the structure to the wet chemical etch in order to completely remove metal base 122 can be established through trial and error.

Advantageously, since the wet chemical etch is not selective of insulative base 124, pillar 160 or encapsulant 176, there is a wide window of acceptable etch times and little or no endpoint concern. Another advantage is that insulative base 124 and encapsulant 176 provide mechanical support for pillar 160, and therefore reduce the mechanical strain on adhesive 174. A further advantage is that pillar 160 extends from insulative base 124 into but not beyond metal base 122, and therefore does not provide an etch mask for metal base 122. A still further advantage is that insulative base 124 protects conductive trace 162 from chemical and mechanical damage by the wet chemical etch and subsequent cleaning steps (such as rinsing in distilled water and air blowing). For instance, insulative base 124 protects routing line 150 from chemical attack by the wet chemical etch, protects routing line 150 from the physical force of the wet chemical etch and cleaning steps that might otherwise cause routing line 150 to separate from adhesive 174, and protects the lower portion of pillar 160 from the physical force of the wet chemical etch and cleaning steps that might otherwise cause pillar 160 to separate from routing line 150. Accordingly, insulative base 124 improves the structural integrity and allows the wet chemical etch and subsequent cleaning steps to be applied more vigorously, thereby improving manufacturing throughput.

At this stage, adhesive 174 continues to cover pad 116, insulative base 124 and encapsulant 176 provide enhanced mechanical support for conductive trace 162, and encapsulant 176 provides protection for chip 110. The enhanced mechanical strength is particularly useful after metal base 122 is removed. Furthermore, the compressibility of encapsulant 176 permits pillar 160 to provide a compressible, compliant contact terminal. That is, pillar 160 exhibits elastic deformation in response to external pressure. As a result, pillar 160 provides excellent compliance for the next level assembly.

FIGS. 1P, 2P, 3P and 4P are cross-sectional, top, bottom and cross-sectional views, respectively, of the structure after portions of insulative base 124 and adhesive 174 are selectively removed to form through-hole 180 in insulative base 124 and adhesive 174 that exposes pad 116 and routing line 150. Through-hole 180 is formed by applying a suitable etch that is highly selective of insulative base 124 and adhesive 174 with respect to pad 116 and routing line 150.

In this instance, a selective laser etch is applied. Using projection laser ablation, a metal mask (not shown) is positioned above insulative base 124 such that an opening in the metal mask is aligned with pad 116, and a laser is directed to the side of the metal mask opposite insulative base 124. Accordingly, the metal mask targets the laser at pad 116. The laser removes portions of insulative base 124 above routing line 150 and removes portions of insulative base 124 and adhesive 174 above pad 116 and outside routing line 150. Through-hole 180 has a diameter of 100 microns, and pad 116 (with a length and width of 70 microns) is centered within and axially aligned with through-hole 180. Routing line 150 shields the underlying adhesive 174 from the laser etch so that the portion of adhesive 174 sandwiched between routing line 150 and pad 116 remains intact. Through-hole 180 is formed in insulative base 124 and adhesive 174 without damaging pad 116, passivation layer 118 or routing line 150. Thus, through-hole 180 extends through laminated structure 120 and adhesive 174, but does not extend into chip 110.

FIGS. 1Q, 2Q, 3Q and 4Q are cross-sectional, top, bottom and cross-sectional views, respectively, of connection joint 182 formed on pad 116 and routing line 150. Connection joint 182 is a conductive adhesive. Connection joint 182 is formed by depositing a non-solidified conductive adhesive and then applying energy to cure the conductive adhesive and form a hardened conductive adhesive joint. Suitable conductive adhesives include a polymer binder (or matrix) and a filler metal powder. Isotropic conductive adhesives in which the electrical conductivity is identical along the three coordinate axes are generally preferred. For instance, conductive epoxy paste that includes an epoxy binder and silver flakes is deposited into through-hole 180 and onto pad 116 and routing line 150 by screen printing. The conductive epoxy paste is then cured by applying UV light.

Connection joint 182 is formed in through-hole 180 and contacts and electrically connects pad 116 and routing line 150. Connection joint 182 contacts and covers portions of pad 116 beneath through-hole 180 and outside routing line 150, the surface of routing line 150 that overlaps and faces away from pad 116, and the outer edges (or peripheral sidewalls) of routing line 150 that overlap and are orthogonal to pad 116. Thus, connection joint 182 provides a robust, permanent electrical connection between pad 116 and routing line 150.

Connection joint 182 is the only electrical conductor external to chip 110 that contacts pad 116, adhesive 174 and connection joint 182 are the only materials external to chip 110 that contact pad 116, adhesive 174 and connection joint 182 are the only materials that contact both pad 116 and routing line 150, and pillar 160 is the only electrical conductor that is electrically connected to pad 116 and extends to the side of insulative base 124 opposite chip 110.

At this stage, the manufacture of semiconductor chip assembly 184 that includes chip 110, insulative base 124, conductive trace 162, adhesive 174, encapsulant 176 and connection joint 182 can be considered complete. Conductive trace 162 is mechanically coupled to chip 110 by adhesive 174, and is electrically coupled to chip 110 by connection joint 182. Conductive trace 162 extends beyond an outer edge of chip 110 and provides horizontal fan-out routing (via routing line 150) and vertical routing (via pillar 160) between pad 116 and external circuitry. Insulative base 124 and encapsulant 176 provide mechanical support and environmental protection for the assembly. Moreover, insulative base 124 protects routing line 150 from unwanted solder reflow during the next level assembly.

The semiconductor chip assembly includes other conductive traces embedded in insulative base 124 and adhesive 174, and only a single conductive trace 162 is shown for convenience of illustration. The conductive traces are each connected to a respective pad on chip 110 by a respective connection joint. Furthermore, the conductive traces each extend horizontally from their respective pads and contain a pillar at a distal end outside the periphery of chip 110 to provide horizontal fan-out routing and vertical routing for their respective pads. The pillars are the only electrical conductors that extend to the surface of insulative base 124 that faces away from chip 110. Thus, all horizontal routing for the pads that is external to chip 110 occurs at the routing lines between insulative base 124 and chip 110. The conductive traces are electrically isolated from one another by insulative base 124 and adhesive 174 after metal base 122 is removed. Advantageously, there is no plating bus or related circuitry that need be disconnected or severed from chip 110 or the conductive traces after metal base 122 is removed and the connection joints are formed.

The semiconductor chip assembly described above is merely exemplary. Numerous other embodiments are contemplated. For instance, in some applications the metal base, the via, the pillar and/or the encapsulant can be omitted.

Figure 5:
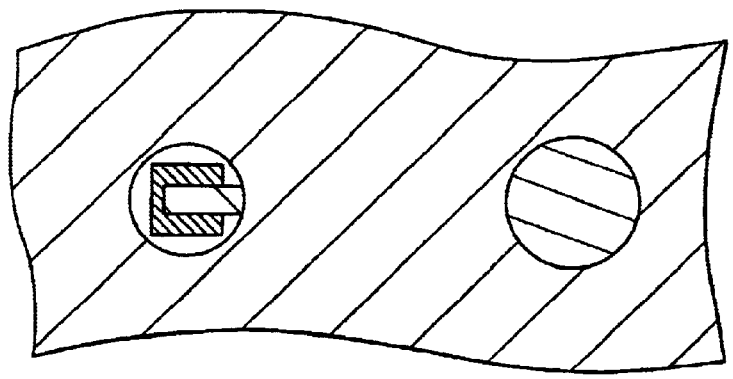
FIGS. 5–9 are top plan views of routing line variations in accordance with the present invention.
Figure 6:
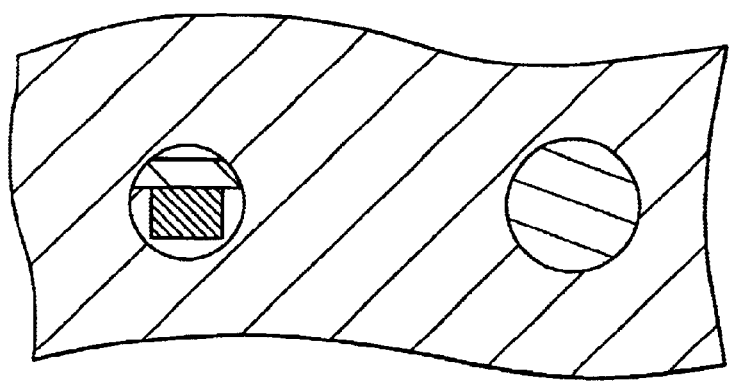
Figure 7:
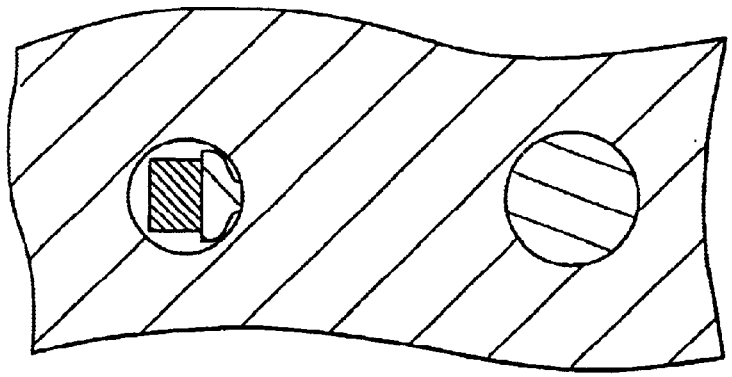
Figure 8:
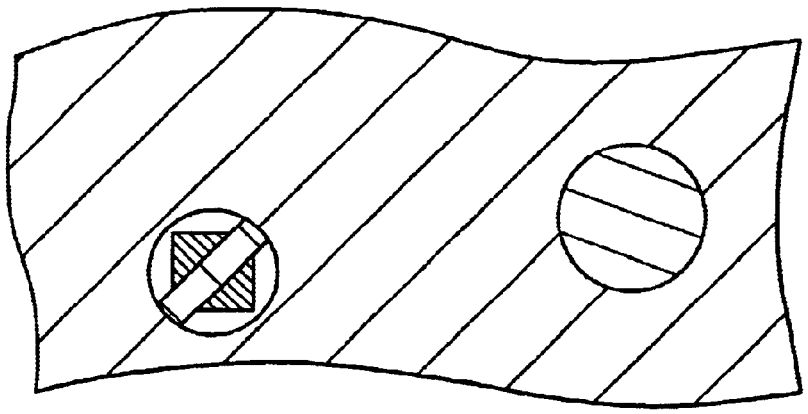
Figure 9:
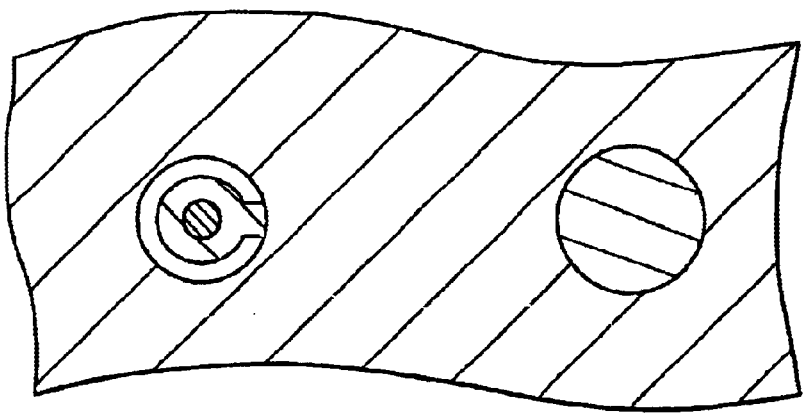

The conductive trace can have various shapes and sizes. The conductive trace can overlap various portions of the pad, such as two opposing peripheral edges and the center of the pad (FIG. 2P), one peripheral edge and the center of the pad (FIG. 5), three peripheral edges but not the center of the pad (FIGS. 6 and 7), two corners and the center of the pad (FIG. 8) or four peripheral edges but not the center of the pad (FIG. 9).

The conductive trace can be various conductive metals including copper, gold, nickel, aluminum, palladium, tin, combinations thereof, and alloys thereof. The preferred composition of the conductive trace will depend on the nature of the connection joint as well as design and reliability factors. Furthermore, those skilled in the art will understand that in the context of a semiconductor chip assembly, a copper material is typically a copper alloy that is mostly copper but not pure elemental copper, such copper-zirconium (99.9% copper), copper-silver-phosphorus-magnesium (99.7% copper), or copper-tin-iron-phosphorus (99.7% copper). The conductive trace may function as a signal, power or ground layer depending on the purpose of the associated chip pad. Likewise, the conductive trace can fan-in or fan-out or both, regardless of whether it includes a pillar.

The laminated structure can be formed with a wide variety of materials through a wide variety of techniques. For instance, laminated structures that consist of a metal base, an insulative base and a metal layer (with the insulative base sandwiched between the metal base and the metal layer) are generally preferred, and laminated structures in which the metal base and the metal layer are copper are generally more preferred due to their widespread availability and tendency to remain flat without warpage. Commercially available laminates such as NEOFLEX™ diclad by Mitsui Chemicals of Tokyo, Japan are suitable. However, other laminated structures such as single clad laminates (that omit the metal base) and dual-insulator laminates (in which the metal base is replaced by a second insulative base that can be selectively etched with respect to the insulative base and the pillar) can also be employed.

The metal base and the metal layer can be various metals such as copper, gold, nickel, aluminum, palladium, tin, combinations thereof, and alloys, and need not necessarily have the same composition.

The metal base and the metal layer can each be a single layer or multiple layers. If desired, the metal layer (or routing line) can be spot plated near the pad to make it compatible with receiving the connection joint. For instance, a copper routing line can be spot plated with nickel and then silver to make it compatible with a gold ball bond connection joint and avoid the formation of brittle silver-copper intermetallic compounds. As another example, the metal layer can include a non-copper layer between a copper layer and the insulative base. Suitable non-copper layers include nickel, gold, palladium and silver. A gold layer is well-suited for receiving a gold ball bond connection joint.

The metal base need not necessarily be removed. For instance, a portion of the metal base above the pad can be selectively etched to permit formation of the through-hole, and another portion of the metal base that contacts the pillar can remain intact and provide part of the conductive trace. Alternatively, a portion of the metal base above the pad can be selectively etched to permit formation of the through-hole, another portion of the metal base that contacts the pillar can be selectively etched so that the pillar is electrically isolated from the metal base, and another portion of the metal base that is disposed within the periphery of the chip can remain intact and provide a heat sink.

The insulative base may be rigid or flexible, and can be various dielectric films or prepregs formed from numerous organic or inorganic insulators such as tape (polyimide), epoxy, silicone, glass, aramid and ceramic. Organic insulators are preferred for low cost, high dielectric applications, whereas inorganic insulators are preferred when high thermal dissipation and a matched thermal coefficient of expansion are important. For instance, the insulative base can initially be an epoxy paste that includes an epoxy resin, a curing agent, an accelerator and a filler, that is subsequently cured or hardened to form a solid adherent insulative layer. The filler can be an inert material such as silica (powdered fused quartz) that improves thermal conductivity, thermal shock resistance and thermal coefficient of expansion matching. Organic fiber reinforcement may also be used in the epoxy resin. Fibers that may be used include aramid, polyester, polyamide, poly-ether-ether-ketone, polyimide, polyetherimide and polysulfone. The fiber reinforcement can be woven fabric, non-woven fabric or paper. Commercially available dielectric materials such as SPEEDBOARD C prepreg by W. L. Gore & Associates of Eau Claire, Wis. are suitable.

The insulative base may be disposed between the metal base and the metal layer in numerous manners. For instance, an epoxy resin without reinforcement can be coated onto the metal base and then laminated to the metal base and the metal layer as heat and pressure are applied. Alternatively, a prepreg with reinforcement can be a dry film that is sandwiched between the metal base and the metal layer and then laminated to the metal base and the metal layer as heat and pressure are applied.

The via can be formed with numerous configurations. Preferably, the via extends through the insulative base and reaches the metal base and the routing line. The via may terminate at, or extend into but not through, or extend through the metal base. Likewise, the via may terminate at, or extend into but not through, or extend through the routing line.

The via can be formed with numerous processes. For example, a solder mask can be deposited on the metal base, the via can be formed through the solder mask, the metal base, the insulative base and the metal layer, and then the metal layer can be clamped to a flat surface. In this instance, the solder paste is deposited into the via through a stencil on the solder mask, and the flat surface plugs the via. As another example, a first solder mask can be deposited on the metal base, a second solder mask can be deposited on the metal layer, and the via can be formed through the first solder mask, the metal base, the insulative base and the metal layer, and into but not through the second solder mask. In this instance, the solder paste is deposited into the via through a stencil on the first solder mask, and the second solder mask plugs the via. As a further example, a solder mask can be deposited on the metal base, and the via can be formed through the solder mask, the metal base and the insulative base, and into but not through the metal layer. In this instance, the solder paste is deposited into the via through a stencil on the solder mask, and the metal layer plugs the via. As yet another example, a solder mask can be deposited on the metal layer, and the via can be formed through the solder mask, the metal layer and the insulative base, and into but not through the metal base. In this instance, the solder paste is deposited into the via through a stencil on the solder mask, and the metal base plugs the via.

Moreover, in any of these approaches, the metal layer can be etched to form the routing line at various stages. For instance, a photoresist layer can be formed on the metal layer before or after the via is formed, before or after the solder paste is deposited into the via, and before or after the solder paste is reflowed. Similarly, the metal layer can be etched using the photoresist layer as an etch mask to form the routing line before or after the via is formed, before or after the solder paste is deposited into the via, and before or after the solder paste is reflowed. Similarly, the photoresist layer can be stripped before or after the via is formed, before or after the solder paste is deposited into the via, and before or after the solder paste is reflowed. It is often preferable to avoid subjecting the photoresist to a solder paste reflow operation since the heat may decompose the photoresist and stripping decomposed photoresist may be difficult. However, other etch masks such as tin or nickel etch masks may be unaffected by the reflow operation. Likewise, the pillar can be formed by other techniques that require less heat.

The via can be formed in numerous manners. For instance, the via can be formed with a single removal step such as mechanical drilling, mechanical punching or laser drilling. Alternatively, the via can be formed with multiple removal steps. For example, a first solder mask can be deposited on the metal base, a second solder mask can be deposited on the metal layer, and the via can be formed through the first solder mask using laser drilling, then through the metal base using wet chemical etching, then through the insulative base using laser drilling, then through the metal layer using wet chemical etching. In this instance, the solder paste is deposited into the via through a stencil on the first solder mask, and the second solder mask plugs the via.

The pillar is particularly well-suited for interconnecting to the next level assembly. The pillar need not necessarily extend above the insulative base, and a ball, pad or pillar (columnar post) can be subsequently deposited on the pillar. Likewise, the pillar can be disposed within or outside the periphery of the chip. The pillar can be formed with numerous techniques. For instance, molten solder or conductive adhesive can be deposited into the via. As another example, high temperature solder paste can be deposited into the via and reflowed to provide a lower pillar portion that contacts the routing line, and then low temperature solder paste can be deposited into the via and onto the lower pillar portion and reflowed (without reflowing the lower pillar portion) to provide an upper pillar portion. Since the reflowed solder occupies substantially less volume than the solder paste, repeated solder paste deposition and reflow may be necessary to fabricate the pillar with sufficient height. Furthermore, a solder pillar with a low temperature upper pillar portion and a high temperature lower pillar portion is well-suited for a solder reflow operation during the next level assembly that melts only the upper pillar portion. A typical low temperature solder is 63% Sn, 37% Pb with a melting point of 183° C., and a typical high temperature solder is 5% Sn, 95% Pb with a melting point of 312° C.

The pad can have numerous shapes including a flat rectangular shape and a bumped shape. For instance, a bump-shaped pad may extend into the through-hole and may even extend above the routing line. The pad can either be partially or completely exposed prior to forming the connection joint. The pad can have a length and width that are larger than, equal to, or smaller than the diameter of the through-hole. Preferably, the pad and through-hole have the same or similar size, and a substantial portion of the pad is directly beneath the through-hole. If desired, the pad can be treated to accommodate the connection joint. For instance, the pad can be rendered catalytic to an electroless nickel connection joint by depositing several metal layers, such as chromium/copper/gold or titanium/nickel/gold on the aluminum base, or alternatively, zincating the aluminum base and electrolessly plating a nickel surface layer on the zincated aluminum base.

Numerous adhesives can be applied between the chip and the conductive trace. For instance, the adhesive can be applied as a paste, a laminated layer, or a liquid applied by screen-printing, spin-on, or spray-on. If a paste or liquid adhesive is applied, the adhesive may contact the insulative base, whereas if a laminated adhesive is applied then no appreciable amount of adhesive may contact the insulative base. Thermosetting adhesive liquids and pastes such as epoxies are generally suitable. Likewise, thermoplastic adhesives such as an insulative thermoplastic polyimide film with a glass transition temperature (Tg) of 400° C. are also generally suitable.

The through-hole may be formed either before or after mechanically attaching the conductive trace to the chip. For instance, the adhesive can be applied as a liquid or paste (A stage) to the bottom surface of the conductive trace, the adhesive can be partially cured (B stage), a back-side etch can form the through-hole in the insulative base and the adhesive, the partially cured adhesive can be brought into contact with the chip, and then the adhesive can be fully cured (C stage). Alternatively, the liquid or paste adhesive can be sandwiched between the chip and the conductive trace, the adhesive can be fully cured thereby mechanically fastening the chip to the conductive trace, and then a front-side etch can form the through-hole in the insulative base and the adhesive.

The through-hole can be formed with numerous etching techniques. For instance, the through-hole can be formed by laser direct write (without a mask). In addition, the through-hole can have a circular, ovular, square, rectangular or other shape (as viewed from the top surface of the insulative base). The through-hole may be aligned with and expose a single pad or a plurality of pads. Furthermore, the through-hole sidewalls may have a wide variety of shapes and slopes including vertical sidewalls, tapered sidewalls, continuous sidewalls and stepped sidewalls.

The encapsulant can be deposited on the chip using a wide variety of techniques including printing and transfer molding. For instance, the encapsulant can be printed on the chip as an epoxy paste and then cured or hardened to form a solid adherent protective layer. The encapsulant can be any of the adhesives mentioned above. Moreover, the encapsulant need not necessarily contact the chip.

The connection joint can be formed from a wide variety of materials including copper, gold, nickel, palladium, tin, alloys thereof, and combinations thereof, can be formed by a wide variety of processes including electroplating, electroless plating, ball bonding, solder reflowing and conductive adhesive curing, and can have a wide variety of shapes and sizes. The shape and composition of the connection joint depends on the composition of the routing line and the pillar as well as design and reliability considerations. Further details regarding an electroplated connection joint are disclosed in U.S. application Ser. No. 09/865,367 filed May 24, 2001 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. application Ser. No. 09/864,555 filed May 24, 2001 by Charles W. C. Lin entitled "Semiconductor Chip Assembly with Simultaneously Electrolessly Plated Contact Terminal and Connection Joint" which is incorporated by reference. Further details regarding a ball bond connection joint are disclosed in U.S. application Ser. No. 09/864,773 filed May 24, 2001 by Charles W. C. Lin entitled "Semiconductor Chip Assembly with Ball Bond Connection Joint" which is incorporated by reference. Further details regarding a solder or conductive adhesive connection joint are disclosed in U.S. application Ser. No. 09/927,216 filed Aug. 10, 2001 by Charles W. C. Lin entitled "Semiconductor Chip Assembly with Hardened Connection Joint" which is incorporated by reference.

After the connection joint is formed, further encapsulation can be performed but is generally not necessary. However, it may be desirable to provide further encapsulation to enhance the mechanical strength of the assembly in the event the encapsulant and/or insulative base are particularly thin or omitted. Likewise, further encapsulation can be used to cover the connection joint.

After the connection joint is formed, a soldering material or solder ball can be deposited over the pillar by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly. Moreover, the pillar can be formed with solder, thereby rendering additional soldering material unnecessary. That is, the pillar itself can be reflowed to provide a solder joint for electrical connection with the next level assembly.

After the connection joint is formed, if a plating bus exists then it is disconnected from the conductive trace. The plating bus can be disconnected by mechanical sawing, laser cutting, chemical etching, and combinations thereof. If the plating bus is disposed about the periphery of the assembly but is not integral to the assembly, then the plating bus can be disconnected when the assembly is singulated from other assemblies. However, if the plating bus is integral to the assembly, or singulation has already occurred, then a photolithography step can be added to selectively cut related circuitry on the assembly that is dedicated to the plating bus since this circuitry would otherwise short the conductive traces together.

The "upper" and "lower" surfaces of the chip and the "top" and "bottom" surfaces of the conductive trace do not depend on the orientation of the assembly, as will be readily apparent to those skilled in the art. For instance, the upper surface of the chip includes the pad and faces the bottom surface of the conductive trace, and the top surface of the conductive trace faces away from the chip, regardless of whether the assembly is inverted and/or mounted on a printed circuit board. Similarly, the conductive trace is disposed "above" the chip when the bottom surface of the conductive trace faces the upper surface of the chip regardless of whether the assembly is inverted. Likewise, the routing line is shown above the chip, the insulative base is shown above the routing line, and the metal base is shown above the insulative base with a single orientation throughout the drawings for ease of comparison between the figures, although the assembly and its components may be inverted at various manufacturing stages.

The working format for the semiconductor chip assembly can be a single chip, a wafer, a strip or a panel based on the manufacturing design. For instance, when the working format is a wafer, numerous assemblies are simultaneously batch manufactured on a single wafer and then separated from one another during singulation. As another example, when the working format is a strip (or reel-to-reel) form, the chips are individually attached to the strip. Semiconductor chip assemblies manufactured using a strip can be chip scale packages, chip size packages, column grid arrays, or other structures. The wafer-based approach employs fewer steps and is less time consuming than the strip-based approach, however the strip-based approach is easier to control and has better dimensional stability than the wafer-based approach since aligning the conductive traces with the pads involves a single chip rather than the entire wafer.

Advantageously, the semiconductor chip assembly of the present invention is reliable and inexpensive. The insulative base and the encapsulant protect the chip from handling damage and provide a known dielectric barrier for the conductive trace. The insulative base and the encapsulant also provide critical mechanical support for the conductive trace during and after the metal base removal. The insulative base prevents solder reflow from electrically shorting the underlying routing line. The pillar yields enhanced reliability for the next level assembly and avoids the need for separate solder balls after the conductive trace is attached to the chip. The mode of the connection shifts from the initial mechanical coupling to metallurgical coupling to assure sufficient metallurgical bond strength. Furthermore, the conductive trace can be mechanically and metallurgically coupled to the chip without wire bonding, TAB or solder joints, although the process is flexible enough to accommodate these techniques if desired. As a result, the assembly of the present invention significantly enhances throughput, yield and performance characteristics compared to conventional packaging techniques. Moreover, the assembly of the present invention is well-suited for use with materials compatible with copper chip requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

I claim:

1. A method of connecting a conductive trace and an insulative base to a semiconductor chip, comprising:
   providing a semiconductor chip, a conductive trace, an insulative base and a metal base, wherein the chip includes a conductive pad, the conductive trace contacts a side of the insulative base that faces towards the chip, the metal base contacts a side of the insulative base that faces away from the chip, and the metal base overlaps the pad; then
   forming a through-hole that extends through the insulative base and exposes the conductive trace and the pad; and then
   forming a connection joint that contacts and electrically connects the conductive trace and the pad.

2. The method of claim 1, including mechanically attaching the chip to the conductive trace using an insulative adhesive before forming the through-hole.

3. The method of claim 2, including forming the through-hole to extend through the insulative base and the adhesive before forming the connection joint.

4. The method of claim 3, wherein the adhesive contacts and is sandwiched between the conductive trace and the pad, and the conductive trace and the pad are electrically isolated from one another after forming the through-hole and before forming the connection joint.

5. The method of claim 3, including attaching the conductive trace to the insulative base before attaching the chip to the conductive trace.

6. The method of claim 3, wherein forming the through-hole includes applying a laser that ablates the insulative base and the adhesive.

7. The method of claim 1, including:
   providing a laminated structure that includes the conductive trace, the insulative base and the metal base; then
   mechanically attaching the laminated structure to the chip; then
   etching the metal base to remove a portion of the metal base that overlaps the pad; and then
   forming the through-hole.

8. The method of claim 7, wherein etching the metal base includes removing the metal base.

9. The method of claim 1, wherein the conductive trace includes copper and the insulative base includes polyimide or epoxy.

10. The method of claim 1, wherein the assembly is devoid of wire bonds and TAB leads.

11. A method of connecting a conductive trace and an insulative base to a semiconductor chip, comprising:
    providing a semiconductor chip that includes a conductive pad;
    providing a laminated structure that includes a conductive trace, an insulative base and a metal base; then
    disposing an insulative adhesive between the chip and the laminated structure, thereby mechanically attaching the chip to the laminated structure such that the metal base is disposed on a side of the insulative base that faces away from the chip, the conductive trace extends to a side of the insulative base that faces towards the chip, and the conductive trace overlaps the pad; then
    removing a portion of the metal base that overlaps the pad; then
    forming a through-hole that extends through the insulative base and the adhesive and exposes the conductive trace and the pad; and then
    forming a connection joint that contacts and electrically connects the conductive trace and the pad.

12. The method of claim 11, wherein the conductive trace overlaps only one peripheral edge of the pad.

13. The method of claim 11 wherein the conductive trace overlaps only two peripheral edges of the pad, and the two peripheral edges are opposite one another.

14. The method of claim 11, wherein the conductive trace overlaps at least one peripheral edge of the pad and overlaps a center of the pad but does not overlap each peripheral edge of the pad.

15. The method of claim 11, wherein the insulative base includes polyimide or epoxy.

16. The method of claim 11, wherein the adhesive includes polyimide or epoxy.

17. The method of claim 11, wherein forming the through-hole includes applying a laser that ablates the insulative base and the adhesive.

18. The method of claim 11, wherein the connection joint contacts a surface of the conductive trace that is disposed above and overlaps and faces away from the pad.

19. The method of claim 11, wherein the connection joint contacts opposing peripheral sidewalls of the conductive trace that are disposed above and overlap and are orthogonal to the pad.

20. The method of claim 11, wherein the connection joint is the only electrical conductor external to the chip that contacts the pad.

21. The method of claim 11, wherein the connection joint and the adhesive are the only materials external to the chip that contact the pad.

22. The method of claim 11, wherein the connection joint and the adhesive are the only materials that contact both the conductive trace and the pad.

23. The method of claim 11, wherein the connection joint is formed by plating.

24. The method of claim 11, wherein the connection joint is a ball bond formed by thermocompression or thermosonic wire bonding.

25. The method of claim 11, wherein the conductive trace includes a routing line and a pillar, the routing line overlaps the pad and extends within and outside a periphery of the chip, the pillar is disposed outside the periphery of the chip, and the pillar extends across opposing major surfaces of the insulative base and contacts the routing line.

26. The method of claim 25, wherein forming the pillar includes:
   forming a via that extends through the insulative base and into the metal base; and
   depositing an electrically conductive material into the via, wherein the electrically conductive material in the via contacts the insulative base and the metal base.

27. The method of claim 26, wherein removing the portion of the metal base includes removing a section of the metal base that contacts the pillar.

28. The method of claim 27, wherein the pillar is the only electrical conductor that is electrically connected to the pad and extends to the side of the insulative base that faces away from the chip.

29. The method of claim 11, wherein the assembly is devoid of wire bonds and TAB leads.

30. The method of claim 11, wherein the chip includes a plurality of conductive pads, a plurality of conductive traces overlap the pads, the metal base covers the pads before removing the portion of the metal base, and the metal base does not overlap any of the pads after removing the portion of the metal base.

31. A method of connecting a conductive trace and an insulative base to a semiconductor chip, comprising the following steps in the sequence set forth:
   providing a laminated structure that includes a conductive trace, an insulative base and a metal base, wherein the conductive trace includes a routing line and a pillar, the metal base and the routing line are disposed on opposite sides of the insulative base, and the pillar contacts the routing line and extends through the insulative base and into the metal base;
   disposing an insulative adhesive between a chip and the laminated structure, thereby mechanically attaching the chip to the laminated structure, wherein the chip includes a pad, the metal base is disposed on a side of the insulative base that faces away from the chip, the routing line is disposed on a side of the insulative base that faces towards the chip and overlaps the pad and extends within and outside a periphery of the chip, and the pillar is disposed outside the periphery of the chip and extends through the insulative base;
   removing portions of the metal base that overlap the pad and contact the pillar;
   forming a through-hole that extends through the insulative base and the adhesive and exposes the routing line and the pad; and
   forming a connection joint that contacts and electrically connects the routing line and the pad.

32. The method of claim 31, wherein forming the conductive trace includes forming the routing line and then forming the pillar.

33. The method of claim 31, wherein forming the routing line includes:
   providing a metal layer in contact with the insulative base;
   forming a photoresist layer on the metal layer that selectively exposes a portion of the metal layer;
   etching the metal layer using the photoresist layer as an etch mask; and
   removing the photoresist layer.

34. The method of claim 33, wherein forming the pillar includes:
   forming a via that extends through the insulative base and into the metal base; and
   depositing an electrically conductive material into the via, wherein the electrically conductive material in the via contacts the insulative base, the metal base and the metal layer.

35. The method of claim 34, wherein the via extends through the metal base and the routing line.

36. The method of claim 34, wherein the via extends through the metal base and into but not through the routing line.

37. The method of claim 34, wherein the via extends through the routing line and into but not through the metal base.

38. The method of claim 34, wherein the electrically conductive material is solder paste.

39. The method of claim 34, wherein the electrically conductive material is conductive adhesive.

40. The method of claim 31, wherein the conductive trace overlaps only one peripheral edge of the pad.

41. The method of claim 31, wherein the conductive trace overlaps only two peripheral edges of the pad, and the two peripheral edges are opposite one another.

42. The method of claim 31, wherein the pillar is the only electrical conductor that is electrically connected to the pad and extends to the side of the insulative base that faces away from the chip after forming the connection joint.

43. The method of claim 31, wherein removing the portions of the metal base includes applying a wet chemical etch that is selective of the metal base with respect to the pillar.

44. The method of claim 31, wherein forming the through-hole includes applying a laser etch that ablates the insulative base and the adhesive.

45. The method of claim 31, wherein forming the connection joint includes plating a metal on the routing line and the pad.

46. The method of claim 31, wherein forming the connection joint includes applying thermocompression or thermosonic wire bonding using a capillary that presses a wire ball against the routing line and the pad to form a ball bond that contacts and bonds to the routing line and the pad.

47. The method of claim 31, wherein the connection joint contacts a surface of the routing line that is disposed above and overlaps and faces away from the pad, and the connection joint contacts a peripheral sidewall of the routing line that is disposed above and overlaps and is orthogonal to the pad.

48. The method of claim 31, wherein the connection joint is the only electrical conductor external to the chip that contacts the pad, the connection joint and the adhesive are the only materials external to the chip that contact the pad, and the connection joint and the adhesive are the only materials that contact both the conductive trace and the pad.

49. The method of claim 31, wherein the metal base and the routing line are essentially copper, and the pillar is essentially solder.

50. The method of claim 31, wherein the assembly is devoid of wire bonds and TAB leads.

51. A method of connecting a conductive trace and an insulative base to a semiconductor chip, comprising:
   providing a laminated structure that includes a metal base, an insulative base and a metal layer, wherein the metal base and the metal layer are disposed on opposite sides of the insulative base;
   forming a via in the laminated structure that extends through the insulative base and into the metal base and the metal layer;
   depositing solder paste into the via;

reflowing the solder paste to form a solder pillar that fills the portion of the via that extends through the insulative base, at least partially fills the portion of the via that extends into the metal base and at least partially fills the portion of the via that extends into the metal layer;
providing an etch mask on the metal layer, wherein the etch mask includes an opening that exposes a portion of the metal layer;
applying an etch to the exposed portion of the metal layer through the opening in the etch mask, thereby forming a routing line from an unetched portion of the metal layer; and then, in the sequence set forth,
mechanically attaching a chip to the laminated structure using an insulative adhesive, wherein the chip includes a pad, a conductive trace includes the routing line and the pillar, the metal base is disposed on a side of the insulative base that faces away from the chip, the routing line is disposed on a side of the insulative base that faces towards the chip, the routing line overlaps the pad and extends within and outside a periphery of the chip, and the pillar contacts the routing line and is disposed outside the periphery of the chip;
removing a first portion of the metal base that overlaps the pad and a second portion of the metal base that contacts the pillar, wherein the pillar extends beyond the insulative base in a direction away from the chip;
forming a through-hole that extends through the insulative base and the adhesive and exposes the routing line and the pad; and
forming a connection joint that contacts and electrically connects the routing line and the pad.

52. The method of claim 51, wherein providing the etch mask includes depositing a photoresist layer on the metal layer and selectively patterning the photoresist layer after forming the via and before reflowing the solder paste.

53. The method of claim 51, wherein removing the first and second portions of the metal base includes applying a wet chemical etch that is highly selective of the metal base with respect to the insulative base and the pillar and removes all of the metal base.

54. The method of claim 51, wherein forming the through-hole includes applying a laser etch that ablates the insulative base and the adhesive.

55. The method of claim 51, wherein forming the connection joint includes depositing a non-solidified material on the routing line and the pad and then hardening the non-solidified material.

56. The method of claim 51, wherein forming the connection joint includes wire bonding a ball bond on the routing line and the pad.

57. The method of claim 51, wherein the via extends through the metal base.

58. The method of claim 51, wherein the via extends through the routing line.

59. The method of claim 51, wherein the metal base and the metal layer are essentially copper, the insulative base includes polyimide or epoxy, and the adhesive includes polyimide or epoxy.

60. The method of claim 51, wherein the assembly is devoid of wire bonds and TAB leads.

61. A method of connecting a conductive trace and an insulative base to a semiconductor chip, comprising:
providing a laminated structure that includes a metal base, an insulative base and a metal layer, wherein the metal base and the metal layer are disposed on opposite sides of the insulative base;
forming a via in the laminated structure that extends through the insulative base and reaches the metal base and the metal layer;
forming a routing line from a first portion of the metal layer by selectively removing a second portion of the metal layer;
forming a pillar in the via, wherein the pillar extends through the insulative base and contacts the metal base and the metal layer; then
mechanically attaching a chip to the laminated structure using an insulative adhesive, wherein the chip includes a pad, a conductive trace includes the routing line and the pillar, the metal base is disposed on a side of the insulative base that faces away from the chip, the routing line is disposed on a side of the insulative base that faces towards the chip, and the pillar contacts the routing line; then
removing portions of the metal base that overlap the pad and contact the pillar;
forming a through-hole that extends through the insulative base and the adhesive and exposes the routing line and the pad; and
forming a connection joint that contacts and electrically connects the routing line and the pad.

62. The method of claim 61, wherein the via extends into the metal base.

63. The method of claim 61, wherein the via extends through the metal base.

64. The method of claim 61, wherein the via extends into the routing line.

65. The method of claim 61, wherein the via extends through the routing line.

66. The method of claim 61, wherein the via extends through the metal base and into but not through the routing line.

67. The method of claim 61, wherein the via extends through the routing line and into but not through the metal base.

68. The method of claim 61, wherein the via extends through the metal base and the routing line.

69. The method of claim 61, wherein forming the via includes mechanical drilling.

70. The method of claim 61, wherein forming the via includes mechanical punching.

71. The method of claim 61, wherein forming the via includes laser drilling.

72. The method of claim 61, wherein forming the via includes wet chemical etching.

73. The method of claim 61, wherein forming the via includes:
forming a first solder mask on a surface of the metal base opposite the insulative base;
forming an opening that extends through the first solder mask, the metal base, the insulative base and the metal layer; and then
forming a second solder mask that plugs the opening at a side opposite the first solder mask.

74. The method of claim 73, wherein forming the pillar includes:
depositing solder paste into the via such that the solder paste in the via contacts the solder masks, the metal base, the insulative base and the metal layer;
reflowing the solder paste to form the pillar; and then
removing the solder masks.

75. The method of claim 61, wherein forming the via includes:
forming a solder mask on a surface of the metal base opposite the insulative base; and then
forming an opening that extends through the first solder mask, the metal base and the insulative base without extending through the metal layer.

76. The method of claim 75, wherein forming the pillar includes:
depositing solder paste into the via such that the solder paste in the via contacts the solder mask, the metal base, the insulative base and the metal layer;
reflowing the solder paste to form the pillar; and then removing the solder mask.

77. The method of claim 61, wherein forming the via includes:
forming a solder mask on a surface of the metal layer opposite the insulative base; and
forming an opening that extends through the solder mask, the metal layer and the insulative base and extends into but not through the metal base.

78. The method of claim 77, wherein forming the pillar includes:
depositing solder paste into the via such that the solder paste in the via contacts the metal base, the insulative base and the metal layer;
reflowing the solder paste to form the pillar; and then removing the solder mask.

79. The method of claim 61, wherein forming the pillar includes depositing solder paste into the via and then reflowing the solder paste.

80. The method of claim 61, wherein forming the pillar includes depositing conductive adhesive into the via and then curing the conductive adhesive.

81. The method of claim 61, wherein removing the portions of the metal base includes applying a wet chemical etch that is selective of the metal base with respect to the pillar and removes all of the metal base.

82. The method of claim 61, wherein forming the through-hole includes applying a laser etch that ablates the insulative base and the adhesive.

83. The method of claim 61, wherein forming the connection joint includes depositing a non-solidified material on the routing line and the pad and then hardening the non-solidified material.

84. The method of claim 61, including forming an encapsulant on the chip, the insulative base and the routing line after attaching the chip to the laminated structure and before removing the portions of the metal base.

85. The method of claim 84, wherein the encapsulant contacts the adhesive without contacting the metal base.

86. The method of claim 61, wherein the connection joint contacts a surface of the routing line that is disposed above and overlaps and faces away from the pad, and the connection joint contacts a peripheral sidewall of the routing line that is disposed above and overlaps and is orthogonal to the pad.

87. The method of claim 61, wherein the connection joint is the only electrical conductor external to the chip that contacts the pad, the connection joint and the adhesive are the only materials external to the chip that contact the pad, the connection joint and the adhesive are the only materials that contact both the routing line and the pad, and the pillar is the only electrical conductor that is electrically connected to the pad and extends to the side of the insulative base that faces away from the chip.

88. The method of claim 61, wherein the steps are performed in the sequence set forth.

89. The method of claim 61, wherein the metal base and the metal layer are copper, the pillar is primarily solder, the insulative base is primarily polyimide or epoxy, and the adhesive is primarily polyimide or epoxy.

90. The method of claim 61, wherein the assembly is devoid of wire bonds and TAB leads.

91. A method of connecting a conductive trace and an insulative base to a semiconductor chip, comprising the following steps in the sequence set forth:
providing a laminated structure that includes a metal base, an insulative base and a metal layer, wherein the metal base and the metal layer are disposed on opposite sides of the insulative base;
forming a via in the laminated structure that extends through the insulative base and into the metal base and the metal layer;
forming a conductive trace that includes a routing line and a pillar, wherein the routing line is formed from an unetched portion of the metal layer, and the pillar is formed in the via from reflowed solder paste and extends through the insulative base and contacts the metal base and the routing line;
mechanically attaching a chip to the laminated structure using an insulative adhesive, wherein the chip includes a pad, the metal base is disposed on a side of the insulative base that faces away from the chip, the routing line is disposed on a side of the insulative base that faces towards the chip, the routing line overlaps the pad and extends within and outside a periphery of the chip, and the pillar is disposed outside the periphery of the chip;
removing a first portion of the metal base that overlaps the pad and a second portion of the metal base that contacts the pillar;
forming a through-hole that extends through the insulative base and the adhesive and exposes the routing line and the pad; and
forming a connection joint that contacts and electrically connects the routing line and the pad.

92. The method of claim 91, wherein the via extends through the metal base and into but not through the routing line.

93. The method of claim 91, wherein the via extends through the routing line and into but not through the metal base.

94. The method of claim 91, wherein the via extends through the metal base and the routing line.

95. The method of claim 91, wherein forming the pillar includes depositing a first solder paste into the via, then reflowing the first solder paste, then depositing a second solder paste into the via, and then reflowing the second solder paste.

96. The method of claim 91, wherein forming the through-hole includes applying a laser etch that ablates the insulative base and the adhesive.

97. The method of claim 91, including forming an encapsulant on the chip, the routing line and the insulative base after attaching the chip to the laminated structure and before removing the first and second portions of the metal base.

98. The method of claim 91, wherein the connection joint contacts a surface of the routing line that is disposed above and overlaps and faces away from the pad, and the connection joint contacts a peripheral sidewall of the routing line that is disposed above and overlaps and is orthogonal to the pad.

99. The method of claim 91, wherein the connection joint is the only electrical conductor external to the chip that contacts the pad, the connection joint and the adhesive are the only materials external to the chip that contact the pad, the connection joint and the adhesive are the only materials that contact both the conductive trace and the pad, and the pillar is the only electrical conductor that is electrically connected to the pad and extends to the side of the insulative base that faces away from the chip.

100. The method of claim 91, wherein the assembly is devoid of wire bonds and TAB leads.

101. A method of connecting a conductive trace and an insulative base to a semiconductor chip, comprising:
providing a semiconductor chip, a conductive trace, an insulative base and a metal base, wherein the chip includes a conductive pad, the conductive trace contacts and adheres to a side of the insulative base that faces towards the chip, the metal base contacts and adheres to a side of the insulative base that faces away from the chip, and the metal base overlaps the chip; then
forming a through-hole that extends through the insulative base and exposes the conductive trace and the pad; and then
forming a connection joint that contacts and electrically connects the conductive trace and the pad.

102. The method of claim 101, including mechanically attaching the chip to the conductive trace using an insulative adhesive before forming the through-hole.

103. The method of claim 102, including forming the through-hole to extend through the insulative base and the adhesive before forming the connection joint.

104. The method of claim 103, wherein the adhesive contacts and is sandwiched between the conductive trace and the pad, and the conductive trace and the pad are electrically isolated from one another after forming the through-hole and before forming the connection joint.

105. The method of claim 103, including attaching the conductive trace to the insulative base before attaching the chip to the conductive trace.

106. The method of claim 103, wherein forming the through-hole includes applying a laser that ablates the insulative base and the adhesive.

107. The method of claim 101, including:
providing a laminated structure that includes the conductive trace, the insulative base and the metal base; then
mechanically attaching the laminated structure to the chip; then
etching the metal base to remove a portion of the metal base that overlaps the pad; and then
forming the through-hole.

108. The method of claim 107, wherein etching the metal base includes removing the metal base.

109. The method of claim 101, wherein the conductive trace includes copper and the insulative base includes polyimide or epoxy.

110. The method of claim 101, wherein the assembly is devoid of wire bonds and TAB leads.

111. A method of connecting a conductive trace and an insulative base to a semiconductor chip, comprising:
providing a semiconductor chip that includes a conductive pad;
providing a laminated structure that includes a conductive trace, an insulative base and a metal base; then
disposing an insulative adhesive between the chip and the laminated structure, thereby mechanically attaching the chip to the laminated structure such that the metal base is disposed on a side of the insulative base that faces away from the chip, the conductive trace extends to a side of the insulative base that faces towards the chip, and the conductive trace overlaps the pad; then
removing a portion of the metal base that overlaps the pad by wet chemical etching, thereby exposing the insulative base; then
forming a through-hole that extends through the insulative base and the adhesive and exposes the conductive trace and the pad; and then
forming a connection joint that contacts and electrically connects the conductive trace and the pad.

112. The method of claim 111, wherein the conductive trace overlaps only one peripheral edge of the pad.

113. The method of claim 111 wherein the conductive trace overlaps only two peripheral edges of the pad, and the two peripheral edges are opposite one another.

114. The method of claim 111, wherein the conductive trace overlaps at least one peripheral edge of the pad and overlaps a center of the pad but does not overlap each peripheral edge of the pad.

115. The method of claim 111, wherein the insulative base includes polyimide or epoxy.

116. The method of claim 111, wherein the adhesive includes polyimide or epoxy.

117. The method of claim 111, wherein forming the through-hole includes applying a laser that ablates the insulative base and the adhesive.

118. The method of claim 111, wherein the connection joint contacts a surface of the conductive trace that is disposed above and overlaps and faces away from the pad.

119. The method of claim 111, wherein the connection joint contacts opposing peripheral sidewalls of the conductive trace that are disposed above and overlap and are orthogonal to the pad.

120. The method of claim 111, wherein the connection joint is the only electrical conductor external to the chip that contacts the pad.

121. The method of claim 111, wherein the connection joint and the adhesive are the only materials external to the chip that contact the pad.

122. The method of claim 111, wherein the connection joint and the adhesive are the only materials that contact both the conductive trace and the pad.

123. The method of claim 111, wherein the connection joint is formed by plating.

124. The method of claim 111, wherein the connection joint is a ball bond formed by thermocompression or thermosonic wire bonding.

125. The method of claim 111, wherein the conductive trace includes a routing line and a pillar, the routing line overlaps the pad and extends within and outside a periphery of the chip, the pillar is disposed outside the periphery of the chip, and the pillar extends across opposing major surfaces of the insulative base and contacts the routing line.

126. The method of claim 125, wherein forming the pillar includes:
forming a via that extends through the insulative base and into the metal base; and
depositing an electrically conductive material into the via, wherein the electrically conductive material in the via contacts the insulative base and the metal base.

127. The method of claim 126, wherein removing the portion of the metal base includes removing a section of the metal base that contacts the pillar.

128. The method of claim 127, wherein the pillar is the only electrical conductor that is electrically connected to the pad and extends to the side of the insulative base that faces away from the chip.

129. The method of claim 111, wherein the assembly is devoid of wire bonds and TAB leads.

130. The method of claim 111, wherein the chip includes a plurality of conductive pads, a plurality of conductive traces overlap the pads, the metal base covers the pads before removing the portion of the metal base, and the metal base does not overlap any of the pads after removing the portion of the metal base.

131. A method of connecting a conductive trace and an insulative base to a semiconductor chip, comprising:

providing a laminated structure that includes a conductive trace, an insulative base and a metal base, wherein the conductive trace includes a routing line and a pillar, the metal base and the routing line are disposed on opposite sides of the insulative base, and the pillar contacts the routing line and extends through the insulative base and into the metal base;

disposing an insulative adhesive between a chip and the laminated structure, thereby mechanically attaching the chip to the laminated structure, wherein the chip includes a pad, the metal base is disposed on a side of the insulative base that faces away from the chip, the routing line is disposed on a side of the insulative base that faces towards the chip and overlaps the pad and extends within and outside a periphery of the chip, and the pillar is disposed outside the periphery of the chip and extends through the insulative base; then removing portions of the metal base that overlap the pad and contact the pillar;

forming a through-hole that extends through the insulative base and the adhesive and exposes the routing line and the pad; and forming a connection joint that contacts and electrically connects the routing line and the pad.

132. The method of claim 131, wherein forming the conductive trace includes forming the routing line and then forming the pillar.

133. The method of claim 131, wherein forming the routing line includes:

providing a metal layer in contact with the insulative base;

forming a photoresist layer on the metal layer that selectively exposes a portion of the metal layer;

etching the metal layer using the photoresist layer as an etch mask; and removing the photoresist layer.

134. The method of claim 133, wherein forming the pillar includes:

forming a via that extends through the insulative base and into the metal base; and depositing an electrically conductive material into the via, wherein the electrically conductive material in the via contacts the insulative base, the metal base and the metal layer.

135. The method of claim 134, wherein the via extends through the metal base and the routing line.

136. The method of claim 134, wherein the via extends through the metal base and into but not through the routing line.

137. The method of claim 134, wherein the via extends through the routing line and into but not through the metal base.

138. The method of claim 134, wherein the electrically conductive material is solder paste.

139. The method of claim 134, wherein the electrically conductive material is conductive adhesive.

140. The method of claim 131, wherein the conductive trace overlaps only one peripheral edge of the pad.

141. The method of claim 131, wherein the conductive trace overlaps only two peripheral edges of the pad, and the two peripheral edges are opposite one another.

142. The method of claim 131, wherein the pillar is the only electrical conductor that is electrically connected to the pad and extends to the side of the insulative base that faces away from the chip after forming the connection joint.

143. The method of claim 131, wherein removing the portions of the metal base includes applying a wet chemical etch that is selective of the metal base with respect to the pillar.

144. The method of claim 131, wherein forming the through-hole includes applying a laser etch that ablates the insulative base and the adhesive.

145. The method of claim 131, wherein forming the connection joint includes plating a metal on the routing line and the pad.

146. The method of claim 131, wherein forming the connection joint includes applying thermocompression or thermosonic wire bonding using a capillary that presses a wire ball against the routing line and the pad to form a ball bond that contacts and bonds to the routing line and the pad.

147. The method of claim 131, wherein the connection joint contacts a surface of the routing line that is disposed above and overlaps and faces away from the pad, and the connection joint contacts a peripheral sidewall of the routing line that is disposed above and overlaps and is orthogonal to the pad.

148. The method of claim 131, wherein the connection joint is the only electrical conductor external to the chip that contacts the pad, the connection joint and the adhesive are the only materials external to the chip that contact the pad, and the connection joint and the adhesive are the only materials that contact both the conductive trace and the pad.

149. The method of claim 131, wherein the metal base and the routing line are essentially copper, and the pillar is essentially solder.

150. The method of claim 131, wherein the assembly is devoid of wire bonds and TAB leads.

151. A method of connecting a conductive trace and an insulative base to a semiconductor chip, comprising:

providing a laminated structure that includes a metal base, an insulative base and a metal layer, wherein the metal base and the metal layer are disposed on opposite sides of the insulative base;

forming a via in the laminated structure that extends through the insulative base and into the metal base and the metal layer;

depositing solder paste into the via;

reflowing the solder paste to form a solder pillar that fills the portion of the via that extends through the insulative base, at least partially fills the portion of the via that extends into the metal base and at least partially fills the portion of the via that extends into the metal layer;

providing an etch mask on the metal layer, wherein the etch mask includes an opening that exposes a portion of the metal layer;

applying an etch to the exposed portion of the metal layer through the opening in the etch mask, thereby forming a routing line from an unetched portion of the metal layer; then mechanically attaching a chip to the laminated structure using an insulative adhesive, wherein the chip includes a pad, a conductive trace includes the routing line and the pillar, the metal base is disposed on a side of the insulative base that faces away from the chip, the routing line is disposed on a side of the insulative base that faces towards the chip, the routing line overlaps the pad and extends within and outside a periphery of the chip, and the pillar contacts the routing line and is disposed outside the periphery of the chip; then removing a first portion of the metal base that overlaps the pad;

removing a second portion of the metal base that contacts the pillar, wherein the pillar extends beyond the insulative base in a direction away from the chip and the metal base does not contact the pillar;

forming a through-hole that extends through the insulative base and the adhesive and exposes the routing line and the pad; and forming a connection joint that contacts and electrically connects the routing line and the pad.

152. The method of claim 151, wherein providing the etch mask includes depositing a photoresist layer on the metal layer and selectively patterning the photoresist layer after forming the via and before reflowing the solder paste.

153. The method of claim 151, wherein removing the first and second portions of the metal base includes applying a wet chemical etch that is highly selective of the metal base with respect to the insulative base and the pillar and removes all of the metal base.

154. The method of claim 151, wherein forming the through-hole includes applying a laser etch that ablates the insulative base and the adhesive.

155. The method of claim 151, wherein forming the connection joint includes depositing a non-solidified material on the routing line and the pad and then hardening the non-solidified material.

156. The method of claim 151, wherein forming the connection joint includes wire bonding a ball bond on the routing line and the pad.

157. The method of claim 151, wherein the via extends through the metal base.

158. The method of claim 151, wherein the via extends through the routing line.

159. The method of claim 151, wherein the metal base and the metal layer are essentially copper, the insulative base includes polyimide or epoxy, and the adhesive includes polyimide or epoxy.

160. The method of claim 151, wherein the assembly is devoid of wire bonds and TAB leads.

161. A method of connecting a conductive trace and an insulative base to a semiconductor chip, comprising:

providing a laminated structure that includes a metal base, an insulative base and a metal layer, wherein the metal base and the metal layer are disposed on opposite sides of the insulative base;

forming a via in the laminated structure that extends through the insulative base and reaches the metal base and the metal layer;

forming a routing line from a first portion of the metal layer by selectively removing a second portion of the metal layer;

forming a pillar in the via, wherein the pillar extends through the insulative base and contacts the metal base and the metal layer; then mechanically attaching a chip to the laminated structure using an insulative adhesive, wherein the chip includes a pad, a conductive trace includes the routing line and the pillar, the metal base is disposed on a side of the insulative base that faces away from the chip, the routing line is disposed on a side of the insulative base that faces towards the chip, and the pillar contacts the routing line; then removing a first portion of the metal base that overlaps the pad, thereby exposing a first portion of the insulative base;

removing a second portion of the metal base that contacts the pillar, thereby exposing a second portion of the insulative base;

forming a through-hole that extends through the insulative base and the adhesive and exposes the routing line and the pad; and forming a connection joint that contacts and electrically connects the routing line and the pad.

162. The method of claim 161, wherein the via extends into the metal base.

163. The method of claim 161, wherein the via extends through the metal base.

164. The method of claim 161, wherein the via extends into the routing line.

165. The method of claim 161, wherein the via extends through the routing line.

166. The method of claim 161, wherein the via extends through the metal base and into but not through the routing line.

167. The method of claim 161, wherein the via extends through the routing line and into but not through the metal base.

168. The method of claim 161, wherein the via extends through the metal base and the routing line.

169. The method of claim 161, wherein forming the via includes mechanical drilling.

170. The method of claim 161, wherein forming the via includes mechanical punching.

171. The method of claim 161, wherein forming the via includes laser drilling.

172. The method of claim 161, wherein forming the via includes wet chemical etching.

173. The method of claim 161, wherein forming the via includes:

forming a first solder mask on a surface of the metal base opposite the insulative base;

forming an opening that extends through the first solder mask, the metal base, the insulative base and the metal layer; and then forming a second solder mask that plugs the opening at a side opposite the first solder mask.

174. The method of claim 173, wherein forming the pillar includes:

depositing solder paste into the via such that the solder paste in the via contacts the solder masks, the metal base, the insulative base and the metal layer;

reflowing the solder paste to form the pillar; and then removing the solder masks.

175. The method of claim 161, wherein forming the via includes:

forming a solder mask on a surface of the metal base opposite the insulative base; and then forming an opening that extends through the first solder mask, the metal base and the insulative base without extending through the metal layer.

176. The method of claim 175, wherein forming the pillar includes:

depositing solder paste into the via such that the solder paste in the via contacts the solder mask, the metal base, the insulative base and the metal layer;

reflowing the solder paste to form the pillar; and then removing the solder mask.

177. The method of claim 161, wherein forming the via includes:

forming a solder mask on a surface of the metal layer opposite the insulative base; and forming an opening that extends through the solder mask, the metal layer and the insulative base and extends into but not through the metal base.

178. The method of claim 177, wherein forming the pillar includes:

depositing solder paste into the via such that the solder paste in the via contacts the metal base, the insulative base and the metal layer;

reflowing the solder paste to form the pillar; and then removing the solder mask.

179. The method of claim 161, wherein forming the pillar includes depositing solder paste into the via and then reflowing the solder paste.

180. The method of claim 161, wherein forming the pillar includes depositing conductive adhesive into the via and then curing the conductive adhesive.

181. The method of claim 161, wherein removing the portions of the metal base includes applying a wet chemical etch that is selective of the metal base with respect to the pillar and removes all of the metal base.

182. The method of claim 161, wherein forming the through-hole includes applying a laser etch that ablates the insulative base and the adhesive.

183. The method of claim 161, wherein forming the connection joint includes depositing a non-solidified material on the routing line and the pad and then hardening the non-solidified material.

184. The method of claim 161, including forming an encapsulant on the chip, the insulative base and the routing line after attaching the chip to the laminated structure and before removing the portions of the metal base.

185. The method of claim 184, wherein the encapsulant contacts the adhesive without contacting the metal base.

186. The method of claim 161, wherein the connection joint contacts a surface of the routing line that is disposed above and overlaps and faces away from the pad, and the connection joint contacts a peripheral sidewall of the routing line that is disposed above and overlaps and is orthogonal to the pad.

187. The method of claim 161, wherein the connection joint is the only electrical conductor external to the chip that contacts the pad, the connection joint and the adhesive are the only materials external to the chip that contact the pad, the connection joint and the adhesive are the only materials that contact both the routing line and the pad, and the pillar is the only electrical conductor that is electrically connected to the pad and extends to the side of the insulative base that faces away from the chip.

188. The method of claim 161, wherein the steps before attaching the chip to the laminated structure are performed in the sequence set forth.

189. The method of claim 161, wherein the metal base and the metal layer are copper, the pillar is primarily solder, the insulative base is primarily polyimide or epoxy, and the adhesive is primarily polyimide or epoxy.

190. The method of claim 161, wherein the assembly is devoid of wire bonds and TAB leads.

191. A method of connecting a conductive trace and an insulative base to a semiconductor chip, comprising:

providing a laminated structure that includes a metal base, an insulative base and a metal layer, wherein the metal base and the metal layer are disposed on opposite sides of the insulative base;

forming a via in the laminated structure that extends through the insulative base and into the metal base and the metal layer;

forming a conductive trace that includes a routing line and a pillar, wherein the routing line is formed from an unetched portion of the metal layer, and the pillar is formed in the via from reflowed solder paste and extends through the insulative base and contacts the metal base and the routing line; then mechanically attaching a chip to the laminated structure using an insulative adhesive, wherein the chip includes a pad, the metal base is disposed on a side of the insulative base that faces away from the chip, the routing line is disposed on a side of the insulative base that faces towards the chip, the routing line overlaps the pad and extends within and outside a periphery of the chip, and the pillar is disposed outside the periphery of the chip; then removing a first portion of the metal base that overlaps the pad;

removing a second portion of the metal base that contacts the pillar;

forming a through-hole that extends through the insulative base and the adhesive and exposes the routing line and the pad; and forming a connection joint that contacts and electrically connects the routing line and the pad.

192. The method of claim 191, wherein the via extends through the metal base and into but not through the routing line.

193. The method of claim 191, wherein the via extends through the routing line and into but not through the metal base.

194. The method of claim 191, wherein the via extends through the metal base and the routing line.

195. The method of claim 191, wherein forming the pillar includes depositing a first solder paste into the via, then reflowing the first solder paste, then depositing a second solder paste into the via, and then reflowing the second solder paste.

196. The method of claim 191, wherein forming the through-hole includes applying a laser etch that ablates the insulative base and the adhesive.

197. The method of claim 191, including forming an encapsulant on the chip, the routing line and the insulative base after attaching the chip to the laminated structure and before removing the first and second portions of the metal base.

198. The method of claim 191, wherein the connection joint contacts a surface of the routing line that is disposed above and overlaps and faces away from the pad, and the connection joint contacts a peripheral sidewall of the routing line that is disposed above and overlaps and is orthogonal to the pad.

199. The method of claim 191, wherein the connection joint is the only electrical conductor external to the chip that contacts the pad, the connection joint and the adhesive are the only materials external to the chip that contact the pad, the connection joint and the adhesive are the only materials that contact both the conductive trace and the pad, and the pillar is the only electrical conductor that is electrically connected to the pad and extends to the side of the insulative base that faces away from the chip.

200. The method of claim 191, wherein the assembly is devoid of wire bonds and TAB leads.

201. A method of connecting a conductive trace and an insulative base to a semiconductor chip, comprising:

providing a semiconductor chip, a conductive trace, an insulative base and a metal base, wherein the chip includes a conductive pad, the conductive trace is laminated to a side of the insulative base that faces towards the chip, the metal base contacts the insulative base on a side that faces away from the chip, and the metal base overlaps the chip; then forming a through-hole that extends through the insulative base and exposes the conductive trace and the pad; and then forming a connection joint that contacts and electrically connects the conductive trace and the pad.

202. The method of claim 201, including mechanically attaching the chip to the conductive trace using an adhesive before forming the through-hole.

203. The method of claim 202, including forming the through-hole to extend through the insulative base and the adhesive before forming the connection joint.

204. The method of claim 203, wherein the adhesive contacts and is sandwiched between the conductive trace and the pad, and the conductive trace and the pad are electrically isolated from one another after forming the through-hole and before forming the connection joint.

205. The method of claim 203, including attaching the conductive trace to the insulative base before attaching the chip to the conductive trace.

206. The method of claim 203, wherein forming the through-hole includes applying a laser that ablates the insulative base and the adhesive.

207. The method of claim 201, including:
providing a laminated structure that includes the conductive trace, the insulative base and the metal base; then
mechanically attaching the laminated structure to the chip; then
etching the metal base; and
forming the through-hole.

208. The method of claim 207, wherein etching the metal base includes removing the metal base.

209. The method of claim 201, wherein the conductive trace includes copper and the insulative base includes polyimide or epoxy.

210. The method of claim 201, wherein the assembly is devoid of wire bonds and TAB leads.

211. A method of connecting a conductive trace and an insulative base to a semiconductor chip, comprising:
providing a semiconductor chip that includes a conductive pad;
providing a laminated structure that includes a conductive trace, an insulative base and a metal base; then
disposing an adhesive between the chip and the laminated structure, thereby mechanically attaching the chip to the laminated structure such that the metal base is disposed on a side of the insulative base that faces away from the chip, the conductive trace extends to a side of the insulative base that faces towards the chip, and the metal base and the conductive trace overlap the chip; then
removing a portion of the metal base by wet chemical etching, thereby exposing the insulative base;
forming a through-hole that extends through the insulative base and the adhesive and exposes the conductive trace and the pad; and
forming a connection joint that contacts and electrically connects the conductive trace and the pad.

212. The method of claim 211, wherein the conductive trace overlaps only one peripheral edge of the pad.

213. The method of claim 211 wherein the conductive trace overlaps only two peripheral edges of the pad, and the two peripheral edges are opposite one another.

214. The method of claim 211, wherein the conductive trace overlaps at least one peripheral edge of the pad and overlaps a center of the pad but does not overlap each peripheral edge of the pad.

215. The method of claim 211, wherein the insulative base includes polyimide or epoxy.

216. The method of claim 211, wherein the adhesive includes polyimide or epoxy.

217. The method of claim 211, wherein forming the through-hole includes applying a laser that ablates the insulative base and the adhesive.

218. The method of claim 211, wherein the connection joint contacts a surface of the conductive trace that is disposed above and overlaps and faces away from the pad.

219. The method of claim 211, wherein the connection joint contacts opposing peripheral sidewalls of the conductive trace that are disposed above and overlap and are orthogonal to the pad.

220. The method of claim 211, wherein the connection joint is the only electrical conductor external to the chip that contacts the pad.

221. The method of claim 211, wherein the connection joint and the adhesive are the only materials external to the chip that contact the pad.

222. The method of claim 211, wherein the connection joint and the adhesive are the only materials that contact both the conductive trace and the pad.

223. The method of claim 211, wherein the connection joint is formed by plating.

224. The method of claim 211, wherein the connection joint is a ball bond formed by thermocompression or thermosonic wire bonding.

225. The method of claim 211, wherein the conductive trace includes a routing line and a pillar, the routing line overlaps the pad and extends within and outside a periphery of the chip, the pillar is disposed outside the periphery of the chip, and the pillar extends across opposing major surfaces of the insulative base and contacts the routing line.

226. The method of claim 225, wherein forming the pillar includes:
forming a via that extends through the insulative base and into the metal base; and
depositing an electrically conductive material into the via, wherein the electrically conductive material in the via contacts the insulative base and the metal base.

227. The method of claim 226, wherein removing the portion of the metal base includes removing a section of the metal base that contacts the pillar.

228. The method of claim 227, wherein the pillar is the only electrical conductor that is electrically connected to the pad and extends to the side of the insulative base that faces away from the chip.

229. The method of claim 211, wherein the assembly is devoid of wire bonds and TAB leads.

230. The method of claim 211, wherein the chip includes a plurality of conductive pads, a plurality of conductive traces overlap the pads, and the metal base does not overlap any of the pads after removing the portion of the metal base.

231. A method of connecting a conductive trace and an insulative base to a semiconductor chip, comprising:
providing a laminated structure that includes a conductive trace, an insulative base and a metal base, wherein the conductive trace includes a routing line and a pillar, the metal base and the routing line are disposed on opposite sides of the insulative base, and the pillar contacts the routing line and extends through the insulative base and into the metal base;

disposing an adhesive between a chip and the laminated structure, thereby mechanically attaching the chip to the laminated structure, wherein the chip includes a pad, the metal base is disposed on a side of the insulative base that faces away from the chip, the routing line is disposed on a side of the insulative base that faces towards the chip and extends within and outside a periphery of the chip, and the pillar is disposed outside the periphery of the chip and extends through the insulative base; then removing a portion of the metal base that contacts the pillar;

forming a through-hole that extends through the insulative base and the adhesive and exposes the routing line and the pad; and forming a connection joint that contacts and electrically connects the routing line and the pad.

232. The method of claim 231, wherein forming the conductive trace includes forming the routing line and then forming the pillar.

233. The method of claim 231, wherein forming the routing line includes:

providing a metal layer in contact with the insulative base;

forming a photoresist layer on the metal layer that selectively exposes a portion of the metal layer;

etching the metal layer using the photoresist layer as an etch mask; and removing the photoresist layer.

234. The method of claim 233, wherein forming the pillar includes:

forming a via that extends through the insulative base and into the metal base; and depositing an electrically conductive material into the via, wherein the electrically conductive material in the via contacts the insulative base, the metal base and the metal layer.

235. The method of claim 234, wherein the via extends through the metal base and the routing line.

236. The method of claim 234, wherein the via extends through the metal base and into but not through the routing line.

237. The method of claim 234, wherein the via extends through the routing line and into but not through the metal base.

238. The method of claim 234, wherein the electrically conductive material is solder paste.

239. The method of claim 234, wherein the electrically conductive material is conductive adhesive.

240. The method of claim 231, wherein the conductive trace overlaps only one peripheral edge of the pad.

241. The method of claim 231, wherein the conductive trace overlaps only two peripheral edges of the pad, and the two peripheral edges are opposite one another.

242. The method of claim 231, wherein the pillar is the only electrical conductor that is electrically connected to the pad and extends to the side of the insulative base that faces away from the chip after forming the connection joint.

243. The method of claim 231, wherein removing the portion of the metal base includes applying a wet chemical etch that is selective of the metal base with respect to the pillar.

244. The method of claim 231, wherein forming the through-hole includes applying a laser etch that ablates the insulative base and the adhesive.

245. The method of claim 231, wherein forming the connection joint includes plating a metal on the routing line and the pad.

246. The method of claim 231, wherein forming the connection joint includes applying thermocompression or thermosonic wire bonding using a capillary that presses a wire ball against the routing line and the pad to form a ball bond that contacts and bonds to the routing line and the pad.

247. The method of claim 231, wherein the connection joint contacts a surface of the routing line that is disposed above and overlaps and faces away from the pad, and the connection joint contacts a peripheral sidewall of the routing line that is disposed above and overlaps and is orthogonal to the pad.

248. The method of claim 231, wherein the connection joint is the only electrical conductor external to the chip that contacts the pad, the connection joint and the adhesive are the only materials external to the chip that contact the pad, and the connection joint and the adhesive are the only materials that contact both the conductive trace and the pad.

249. The method of claim 231, wherein the metal base and the routing line are essentially copper, and the pillar is essentially solder.

250. The method of claim 231, wherein the assembly is devoid of wire bonds and TAB leads.

251. A method of connecting a conductive trace and an insulative base to a semiconductor chip, comprising:

providing a laminated structure that includes a metal base, an insulative base and a metal layer, wherein the metal base and the metal layer are disposed on opposite sides of the insulative base;

forming a via in the laminated structure that extends through the insulative base and into the metal base and the metal layer;

depositing solder paste into the via;

reflowing the solder paste to form a solder pillar that fills the portion of the via that extends through the insulative base, at least partially fills the portion of the via that extends into the metal base and at least partially fills the portion of the via that extends into the metal layer;

providing an etch mask on the metal layer, wherein the etch mask includes an opening that exposes a portion of the metal layer;

applying an etch to the exposed portion of the metal layer through the opening in the etch mask, thereby forming a routing line from an unetched portion of the metal layer; then mechanically attaching a chip to the laminated structure using an adhesive, wherein the chip includes a pad, a conductive trace includes the routing line and the pillar, the metal base is disposed on a side of the insulative base that faces away from the chip, the routing line is disposed on a side of the insulative base that faces towards the chip, the routing line extends within and outside a periphery of the chip, and the pillar contacts the routing line and is disposed outside the periphery of the chip; then removing a portion of the metal base that contacts the pillar, wherein the pillar extends beyond the insulative base in a direction away from the chip and the metal base does not contact the pillar;

forming a through-hole that extends through the insulative base and the adhesive and exposes the routing line and the pad; and forming a connection joint that contacts and electrically connects the routing line and the pad.

252. The method of claim 251, wherein providing the etch mask includes depositing a photoresist layer on the metal layer and selectively patterning the photoresist layer after forming the via and before reflowing the solder paste.

253. The method of claim 251, wherein removing the portion of the metal base includes applying a wet chemical etch that is highly selective of the metal base with respect to the insulative base and the pillar.

254. The method of claim 251, wherein forming the through-hole includes applying a laser etch that ablates the insulative base and the adhesive.

255. The method of claim 251, wherein forming the connection joint includes depositing a non-solidified material on the routing line and the pad and then hardening the non-solidified material.

256. The method of claim 251, wherein forming the connection joint includes wire bonding a ball bond on the routing line and the pad.

257. The method of claim 251, wherein the via extends through the metal base.

258. The method of claim 251, wherein the via extends through the routing line.

259. The method of claim 251, wherein the metal base and the metal layer are essentially copper, the insulative base includes polyimide or epoxy, and the adhesive includes polyimide or epoxy.

260. The method of claim 251, wherein the assembly is devoid of wire bonds and TAB leads.

261. A method of connecting a conductive trace and an insulative base to a semiconductor chip, comprising:
providing a laminated structure that includes a metal base, an insulative base and a metal layer, wherein the metal base and the metal layer are disposed on opposite sides of the insulative base;
forming a via in the laminated structure that extends through the insulative base and reaches the metal base and the metal layer;
forming a routing line from a first portion of the metal layer by selectively removing a second portion of the metal layer;
forming a pillar in the via, wherein the pillar extends through the insulative base and contacts the metal base and the metal layer; then
mechanically attaching a chip to the laminated structure using an adhesive, wherein the chip includes a pad, a conductive trace includes the routing line and the pillar, the metal base is disposed on a side of the insulative base that faces away from the chip, the routing line is disposed on a side of the insulative base that faces towards the chip, and the pillar contacts the routing line; then
removing a portion of the metal base that contacts the pillar, thereby exposing a portion of the insulative base;
forming a through-hole that extends through the insulative base and the adhesive and exposes the routing line and the pad; and
forming a connection joint that contacts and electrically connects the routing line and the pad.

262. The method of claim 261, wherein the via extends into the metal base.

263. The method of claim 261, wherein the via extends through the metal base.

264. The method of claim 261, wherein the via extends into the routing line.

265. The method of claim 261, wherein the via extends through the routing line.

266. The method of claim 261, wherein the via extends through the metal base and into but not through the routing line.

267. The method of claim 261, wherein the via extends through the routing line and into but not through the metal base.

268. The method of claim 261, wherein the via extends through the metal base and the routing line.

269. The method of claim 261, wherein forming the via includes mechanical drilling.

270. The method of claim 261, wherein forming the via includes mechanical punching.

271. The method of claim 261, wherein forming the via includes laser drilling.

272. The method of claim 261, wherein forming the via includes wet chemical etching.

273. The method of claim 261, wherein forming the via includes:
forming a first solder mask on a surface of the metal base opposite the insulative base;
forming an opening that extends through the first solder mask, the metal base, the insulative base and the metal layer; and then
forming a second solder mask that plugs the opening at a side opposite the first solder mask.

274. The method of claim 273, wherein forming the pillar includes:
depositing solder paste into the via such that the solder paste in the via contacts the solder masks, the metal base, the insulative base and the metal layer;
reflowing the solder paste to form the pillar; and then
removing the solder masks.

275. The method of claim 261, wherein forming the via includes:
forming a solder mask on a surface of the metal base opposite the insulative base; and then
forming an opening that extends through the first solder mask, the metal base and the insulative base without extending through the metal layer.

276. The method of claim 275, wherein forming the pillar includes:
depositing solder paste into the via such that the solder paste in the via contacts the solder mask, the metal base, the insulative base and the metal layer;
reflowing the solder paste to form the pillar; and then
removing the solder mask.

277. The method of claim 261, wherein forming the via includes:
forming a solder mask on a surface of the metal layer opposite the insulative base; and
forming an opening that extends through the solder mask, the metal layer and the insulative base and extends into but not through the metal base.

278. The method of claim 277, wherein forming the pillar includes:
depositing solder paste into the via such that the solder paste in the via contacts the metal base, the insulative base and the metal layer;
reflowing the solder paste to form the pillar; and then
removing the solder mask.

279. The method of claim 261, wherein forming the pillar includes depositing solder paste into the via and then reflowing the solder paste.

280. The method of claim 261, wherein forming the pillar includes depositing conductive adhesive into the via and then curing the conductive adhesive.

281. The method of claim 261, wherein removing the portion of the metal base includes applying a wet chemical etch that is selective of the metal base with respect to the pillar.

282. The method of claim 261, wherein forming the through-hole includes applying a laser etch that ablates the insulative base and the adhesive.

283. The method of claim 261, wherein forming the connection joint includes depositing a non-solidified material on the routing line and the pad and then hardening the non-solidified material.

284. The method of claim 261, including forming an encapsulant on the chip, the insulative base and the routing line after attaching the chip to the laminated structure and before removing the portion of the metal base.

285. The method of claim 284, wherein the encapsulant contacts the adhesive without contacting the metal base.

286. The method of claim 261, wherein the connection joint contacts a surface of the routing line that is disposed above and overlaps and faces away from the pad, and the connection joint contacts a peripheral sidewall of the routing line that is disposed above and overlaps and is orthogonal to the pad.

287. The method of claim 261, wherein the connection joint is the only electrical conductor external to the chip that contacts the pad, the connection joint and the adhesive are the only materials external to the chip that contact the pad, the connection joint and the adhesive are the only materials that contact both the routing line and the pad, and the pillar is the only electrical conductor that is electrically connected to the pad and extends to the side of the insulative base that faces away from the chip.

288. The method of claim 261, wherein the steps before attaching the chip to the laminated structure are performed in the sequence set forth.

289. The method of claim 261, wherein the metal base and the metal layer are copper, the pillar is primarily solder, the insulative base is primarily polyimide or epoxy, and the adhesive is primarily polyimide or epoxy.

290. The method of claim 261, wherein the assembly is devoid of wire bonds and TAB leads.

291. A method of connecting a conductive trace and an insulative base to a semiconductor chip, comprising:

providing a laminated structure that includes a metal base, an insulative base and a metal layer, wherein the metal base and the metal layer are disposed on opposite sides of the insulative base;

forming a via in the laminated structure that extends through the insulative base and into the metal base and the metal layer;

forming a conductive trace that includes a routing line and a pillar, wherein the routing line is formed from an unetched portion of the metal layer, and the pillar is formed in the via from reflowed solder paste and extends through the insulative base and contacts the metal base and the routing line; then mechanically attaching a chip to the laminated structure using an adhesive, wherein the chip includes a pad, the metal base is disposed on a side of the insulative base that faces away from the chip, the routing line is disposed on a side of the insulative base that faces towards the chip, the routing line extends within and outside a periphery of the chip, and the pillar is disposed outside the periphery of the chip; then removing a portion of the metal base that contacts the pillar;

forming a through-hole that extends through the insulative base and the adhesive and exposes the routing line and the pad; and forming a connection joint that contacts and electrically connects the routing line and the pad.

292. The method of claim 291, wherein the via extends through the metal base and into but not through the routing line.

293. The method of claim 291, wherein the via extends through the routing line and into but not through the metal base.

294. The method of claim 291, wherein the via extends through the metal base and the routing line.

295. The method of claim 291, wherein forming the pillar includes depositing a first solder paste into the via, then reflowing the first solder paste, then depositing a second solder paste into the via, and then reflowing the second solder paste.

296. The method of claim 291, wherein forming the through-hole includes applying a laser etch that ablates the insulative base and the adhesive.

297. The method of claim 291, including forming an encapsulant on the chip, the routing line and the insulative base after attaching the chip to the laminated structure and before removing the portion of the metal base.

298. The method of claim 291, wherein the connection joint contacts a surface of the routing line that is disposed above and overlaps and faces away from the pad, and the connection joint contacts a peripheral sidewall of the routing line that is disposed above and overlaps and is orthogonal to the pad.

299. The method of claim 291, wherein the connection joint is the only electrical conductor external to the chip that contacts the pad, the connection joint and the adhesive are the only materials external to the chip that contact the pad, the connection joint and the adhesive are the only materials that contact both the conductive trace and the pad, and the pillar is the only electrical conductor that is electrically connected to the pad and extends to the side of the insulative base that faces away from the chip.

300. The method of claim 291, wherein the assembly is devoid of wire bonds and TAB leads.

* * * * *

UNITED STATES PATENT AND TRADEMARK OFFICE
CERTIFICATE OF CORRECTION

PATENT NO. : 6,673,710 B1
DATED : January 6, 2004
INVENTOR(S) : Charles W.C. Lin It is certified that error appears in the above-identified patent and that said Letters Patent is hereby corrected as shown below:

Column 25,
Lines 9-10, change "contacts and adheres" to -- is laminated --.
Lines 11-12, change "contacts and adheres" to -- is laminated --.

Column 33,
Lines 1-2, change "is laminated" to -- contacts and adheres --.
Line 3, insert -- and adheres to a side of -- after "contacts".
Line 4, delete "on a side" after "base".

Signed and Sealed this

Twenty-fourth Day of February, 2004

JON W. DUDAS
*Acting Director of the United States Patent and Trademark Office*